(12) United States Patent
Seo et al.

(10) Patent No.: US 9,880,411 B2
(45) Date of Patent: Jan. 30, 2018

(54) LIQUID CRYSTAL DISPLAY AND METHOD OF MANUFACTURING THE SAME

(71) Applicant: Samsung Display Co., Ltd., Yongin (KR)

(72) Inventors: Seung Mi Seo, Hwaseong-si (KR); Suk Won Jung, Goyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 968 days.

(21) Appl. No.: 13/687,542

(22) Filed: Nov. 28, 2012

(65) Prior Publication Data

US 2014/0002764 A1  Jan. 2, 2014

(30) Foreign Application Priority Data

Jun. 29, 2012  (KR) ........................ 10-2012-0070917

(51) Int. Cl.
| | |
|---|---|
| G02F 1/1343 | (2006.01) |
| G02F 1/1333 | (2006.01) |
| G02F 1/1334 | (2006.01) |
| H01L 33/00 | (2010.01) |
| G02F 1/1362 | (2006.01) |

(52) U.S. Cl.
CPC ...... *G02F 1/1334* (2013.01); *G02F 1/133377* (2013.01); *G02F 1/136227* (2013.01); *H01L 33/0041* (2013.01); *G02F 2001/136222* (2013.01); *G02F 2001/136231* (2013.01)

(58) Field of Classification Search
CPC ............. G02F 1/1343; G02F 1/133377; G02F 1/136227; G02F 2001/136222; G02F 2001/136231

USPC .......................................... 349/86, 139, 141
See application file for complete search history.

(56) References Cited

U.S. PATENT DOCUMENTS

| | | | | |
|---|---|---|---|---|
| 5,748,171 | A | * 5/1998 | Ishizaki | G09G 3/3648 345/101 |
| 5,986,729 | A | * 11/1999 | Yamanaka | G02F 1/1333 349/153 |
| 6,141,072 | A | 10/2000 | Drabik et al. | |
| 6,304,309 | B1 | * 10/2001 | Yamanaka | G02F 1/133377 349/153 |
| 6,414,729 | B1 | * 7/2002 | Akiyama | G02F 1/13475 257/E27.111 |

(Continued)

FOREIGN PATENT DOCUMENTS

| | | |
|---|---|---|
| JP | 07-134285 | 5/1995 |
| JP | 2005-316324 | 11/2005 |

(Continued)

*Primary Examiner* — Edward Glick
*Assistant Examiner* — David Chung
(74) *Attorney, Agent, or Firm* — Cantor Colburn LLP

(57) ABSTRACT

A display device includes a substrate, a thin film transistor disposed on the substrate, where the thin film transistor includes a drain electrode, a passivation layer disposed on the substrate covering the thin film transistor, a common electrode disposed on the passivation layer, where the common electrode receives a common voltage, a liquid crystal layer disposed in a microcavity layer on the common electrode, a roof layer disposed covering the liquid crystal layer, and a pixel electrode disposed on the roof layer, and a method of manufacturing the display device is provided.

7 Claims, 49 Drawing Sheets

(56) References Cited

U.S. PATENT DOCUMENTS

| | | | |
|---|---|---|---|
| 6,667,777 B2 * | 12/2003 | Kikkawa | G02F 1/136227 |
| | | | 349/152 |
| 6,912,038 B2 | 6/2005 | Liao et al. | |
| 7,123,319 B2 | 10/2006 | Broer et al. | |
| 7,420,728 B2 | 9/2008 | Tung et al. | |
| 2006/0146267 A1 | 7/2006 | Choi et al. | |
| 2007/0268446 A1 * | 11/2007 | Jeng | B82Y 20/00 |
| | | | 349/166 |
| 2010/0014036 A1 | 1/2010 | Caplet | |
| 2011/0296726 A1 | 12/2011 | Rinko | |
| 2011/0300781 A1 | 12/2011 | Miyata | |
| 2012/0062448 A1 * | 3/2012 | Kim | G02F 1/133377 |
| | | | 345/55 |

FOREIGN PATENT DOCUMENTS

| | | |
|---|---|---|
| JP | 2010-005892 | 1/2010 |
| KR | 10-2003-0063656 | 7/2003 |
| KR | 10-0685940 | 2/2007 |
| KR | 10-2008-0051268 | 6/2008 |
| KR | 10-0875559 | 12/2008 |
| KR | 1020120026880 | 3/2012 |

\* cited by examiner

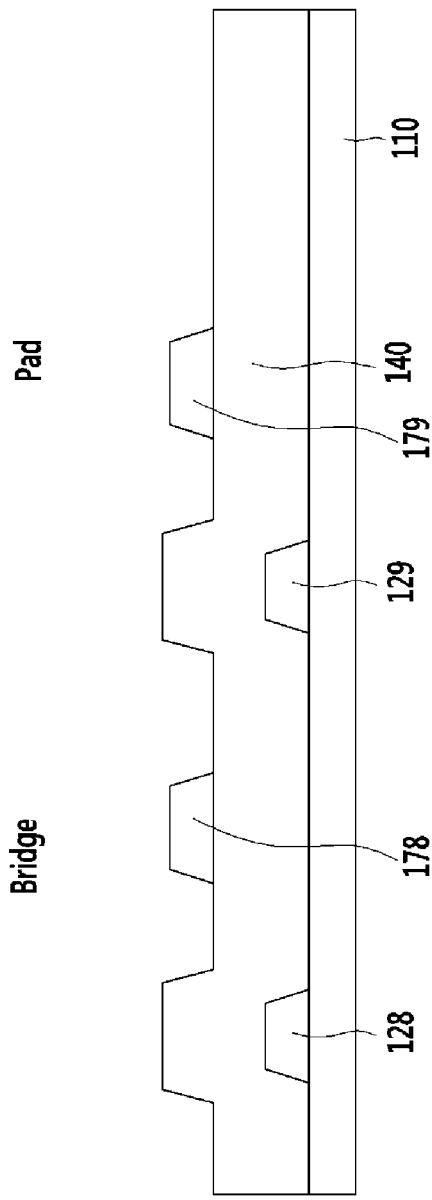

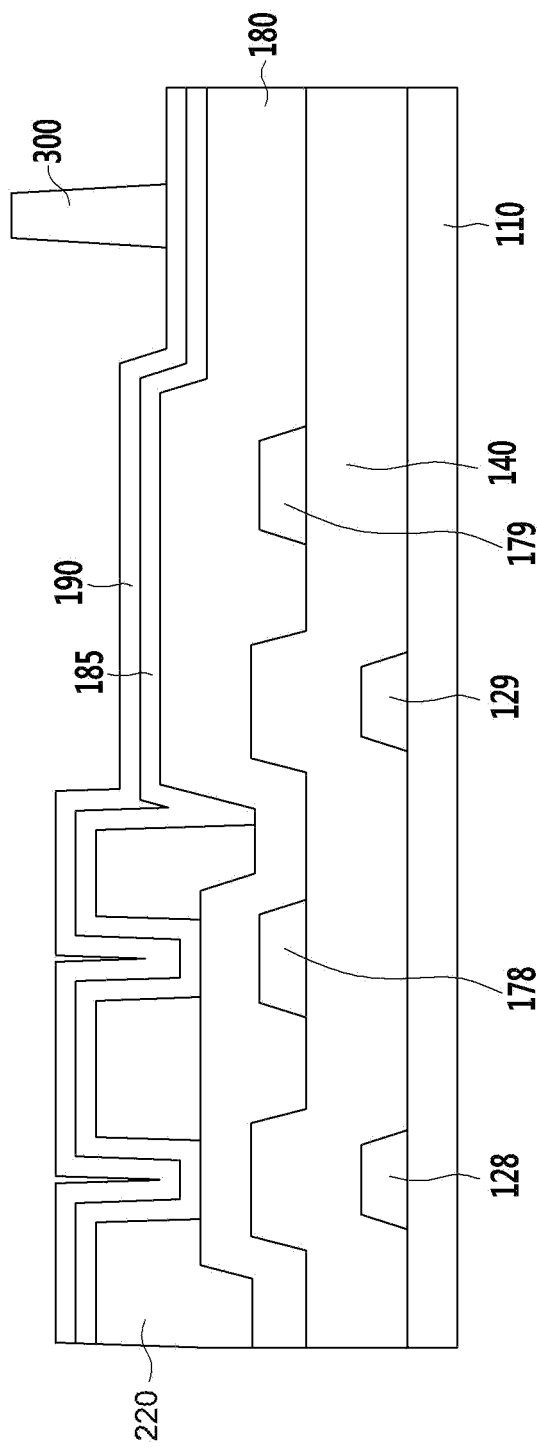

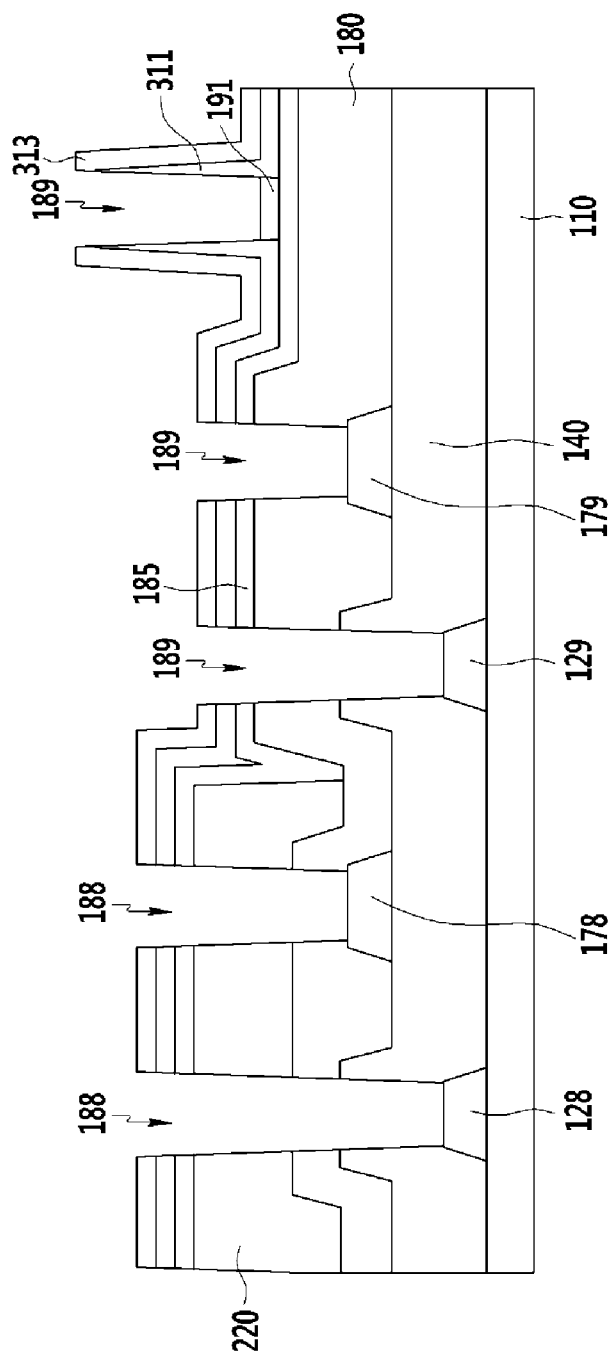

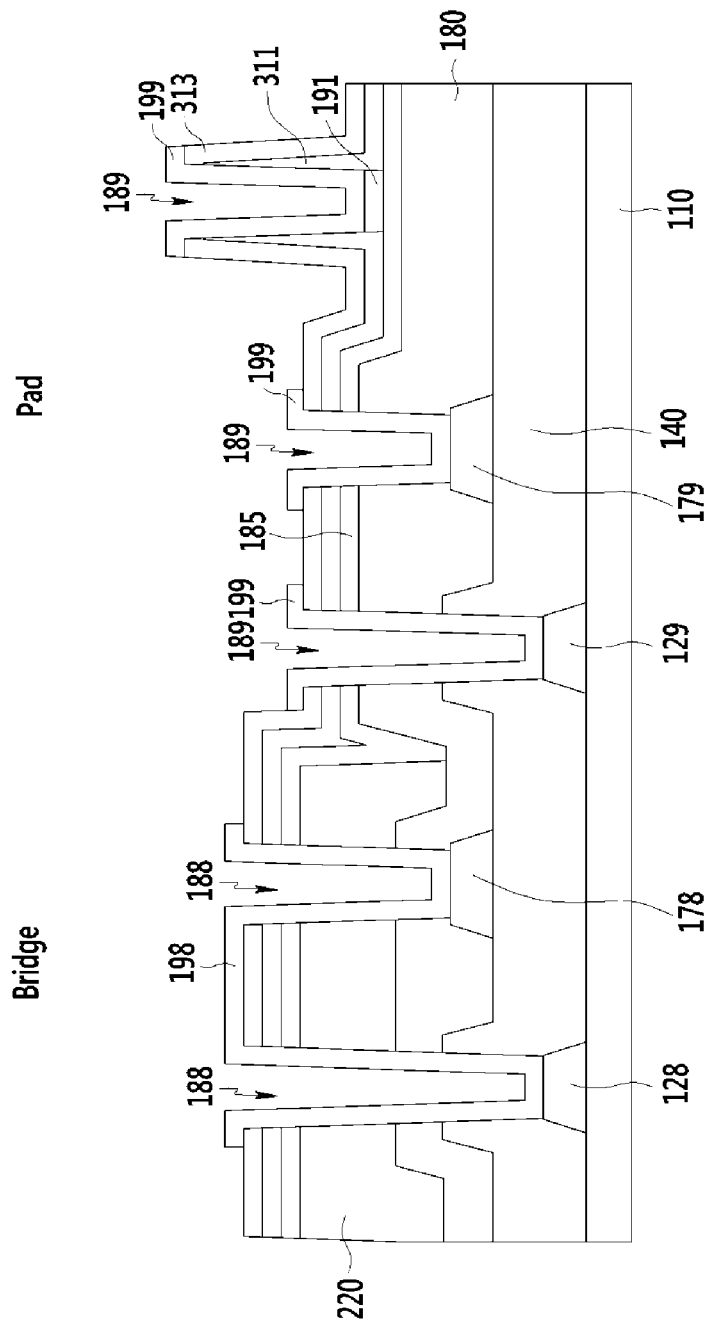

LIQUID CRYSTAL DISPLAY AND METHOD OF MANUFACTURING THE SAME

This application claims priority to Korean Patent Application No. 10-2012-0070917 filed on Jun. 29, 2012, and all the benefits accruing therefrom under 35 U.S.C. § 119, the content of which in its entirety is herein incorporated by reference.

BACKGROUND (a) Field

Exemplary embodiments of the invention relate to a liquid crystal display and a method of manufacturing the liquid crystal display, and more particularly, to a liquid crystal display having a liquid crystal layer present in a microcavity, and a method of manufacturing the liquid crystal display.

(b) Description of the Related Art

A liquid crystal display is one of the most widely used types of flat panel displays, and typically includes two display panels with field generating electrodes such as a pixel electrode and a common electrode, and a liquid crystal layer interposed therebetween.

The liquid crystal display displays an image by applying a voltage to the field generating electrode to generate an electric field in the liquid crystal layer, thereby determining alignment of liquid crystal molecules of the liquid crystal layer, and controlling polarization of incident light.

A liquid crystal display having an embedded microcavity ("EM") structure is a device implementing displaying by forming a sacrificial layer by a photoresist, applying a support member on an upper portion thereof, removing the sacrificial layer by an ashing process, and filling liquid crystal in a space formed by removing the sacrificial layer. In a conventional method of manufacturing the liquid crystal display having the EM structure, a plurality of processes, such as a process of etching one side of the EM structure to provide openings, are typically performed to remove the sacrificial layer, a number of masks are used in each process, and the manufacturing time and cost are thereby increased.

SUMMARY

Exemplary embodiments of the invention relate to a liquid crystal display and a method of manufacturing the liquid crystal display, in which the manufacturing time and cost is substantially reduced.

An exemplary embodiment of the invention provides a display device including: a substrate; a thin film transistor disposed on the substrate, where the thin film transistor includes a drain electrode; a passivation layer disposed on the substrate covering the thin film transistor; a common electrode disposed on the passivation layer, where the common electrode receives a common voltage; a liquid crystal layer disposed in a microcavity layer on the common electrode; a roof layer disposed covering the liquid crystal layer; and a pixel electrode disposed on the roof layer.

In an exemplary embodiment, an opening may be defined in the roof layer at a drain electrode exposing region, through which the drain electrode of the thin film transistor is exposed, and an opening may be defined in the roof layer at a pixel electrode region, in which the pixel electrode is disposed.

In an exemplary embodiment, a connection opening which connects the opening of the drain electrode exposing region and the opening of the pixel electrode region may be defined in the roof layer.

In an exemplary embodiment, the pixel electrode may be disposed in a region on the opening of the pixel electrode region, the opening of the drain electrode exposing region and the connection opening connecting the openings.

In an exemplary embodiment, a side of the common electrode may be substantially aligned with a corresponding side of the microcavity layer.

In an exemplary embodiment, the side of the common electrode may extend in an extension direction of the common electrode.

In an exemplary embodiment, the common electrode may not be disposed on the drain electrode exposing region.

In an exemplary embodiment, the display device may further include a color filter disposed between the passivation layer and the common electrode, and a light blocking member disposed between the passivation layer and the common electrode.

Another exemplary embodiment of the invention provides a method of manufacturing a display device, the including: providing a thin film transistor including a drain electrode on a substrate; providing a passivation layer on the substrate covering the thin film transistor; laminating a conductive material on the passivation layer; providing a sacrificial layer on the conductive material; providing a common electrode by etching the conductive material using the sacrificial layer as a mask; providing a roof layer on the sacrificial layer; and providing a pixel electrode on the roof layer.

In an exemplary embodiment, the providing the sacrificial layer and the providing the common electrode may be performed in a same process.

In an exemplary embodiment, the method may further include forming a liquid crystal injection hole and a contact hole, through which the drain electrode is exposed, in a same process after the providing the roof layer.

In an exemplary embodiment, the method may further include providing a microcavity layer by removing the sacrificial layer after forming the liquid crystal injection hole and the contact hole.

In an exemplary embodiment, the providing the pixel electrode may be performed after the providing the microcavity layer, and the providing the pixel electrode may include connecting the drain electrode, which is exposed through the contact hole, and the pixel electrode.

In an exemplary embodiment, the providing the microcavity layer by removing the sacrificial layer may include removing a photoresist used for providing the pixel electrode together with the sacrificial layer by wet etching after the providing the pixel electrode.

In an exemplary embodiment, the method may further include injecting a liquid crystal material into the microcavity layer through the liquid crystal injection hole after the providing the pixel electrode.

In an exemplary embodiment, the method may further include forming the contact hole through which the drain electrode is exposed after the providing the roof layer, where the of the providing the pixel electrode may include connecting the drain electrode exposed through the contact hole and the pixel electrode.

In an exemplary embodiment, the method may further include forming the liquid crystal injection hole after the providing the pixel electrode; and injecting the liquid crystal material into the microcavity layer through the liquid crystal injection hole after the forming the liquid crystal injection hole.

In an exemplary embodiment, the method may further include forming the contact hole, through which the drain electrode is exposed, after the providing the roof layer, where the providing the pixel electrode may include firstly etching the conductive material, and secondly etching the conductive material after the firstly etching the conductive material.

In an exemplary embodiment, the conductive material on a liquid crystal injection hole forming region, in which the liquid crystal injection hole is formed, may be etched by the firstly etching, and the providing the pixel electrode may be completed by the secondly etching.

In an exemplary embodiment, the method may further include removing the sacrificial layer exposed by the first etching to form the liquid crystal injection hole; and providing a microcavity layer by removing the sacrificial layer exposed through the liquid crystal injection hole.

According to one or more exemplary embodiment of the invention, the manufacturing time and cost are substantially reduced by forming a contact hole, through which a pixel electrode and a drain electrode of a thin film transistor are connected to each other, in a process after a sacrificial layer is provided.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
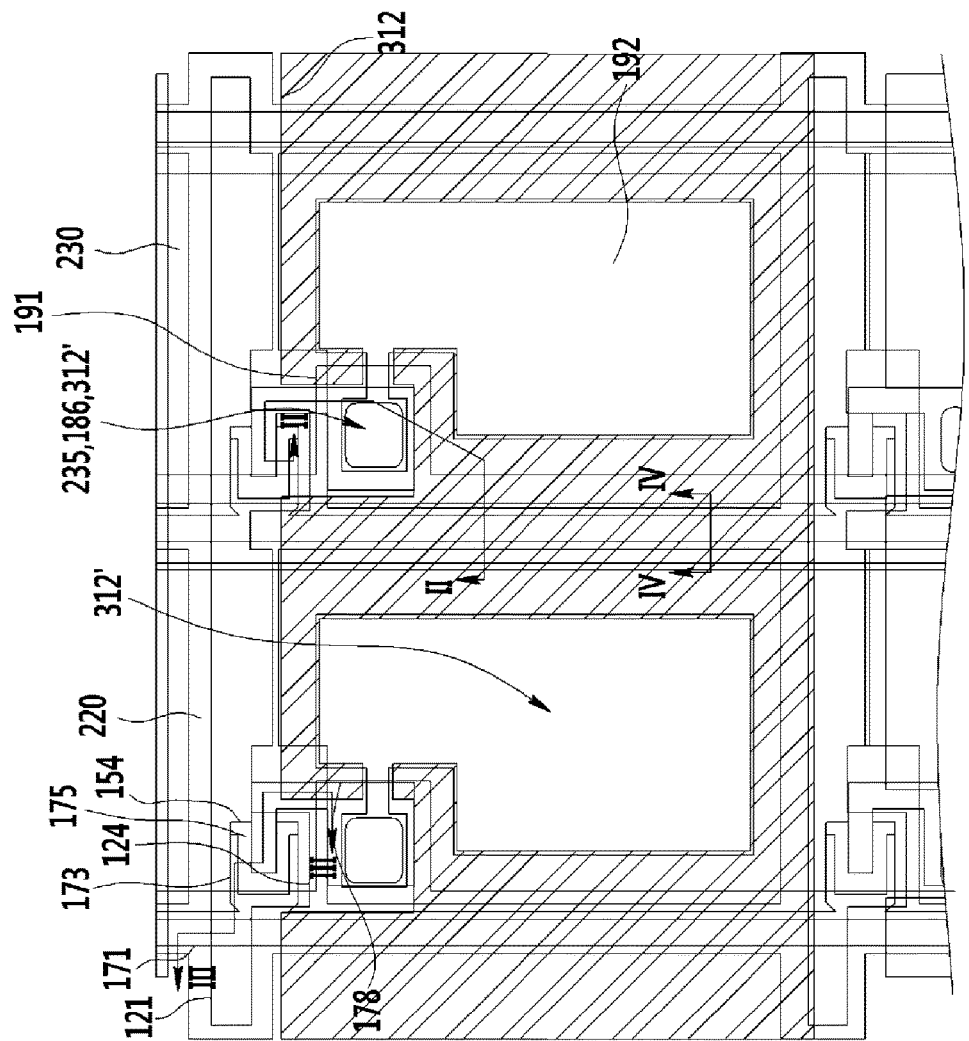
FIG. 1 is a top plan view of an exemplary embodiment of a liquid crystal display according to the invention.

The invention will be described more fully hereinafter with reference to the accompanying drawings, in which exemplary embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, an exemplary embodiment of a liquid crystal display according to the invention will be described in detail with reference to FIGS. 1 to 5.

Figure 2:
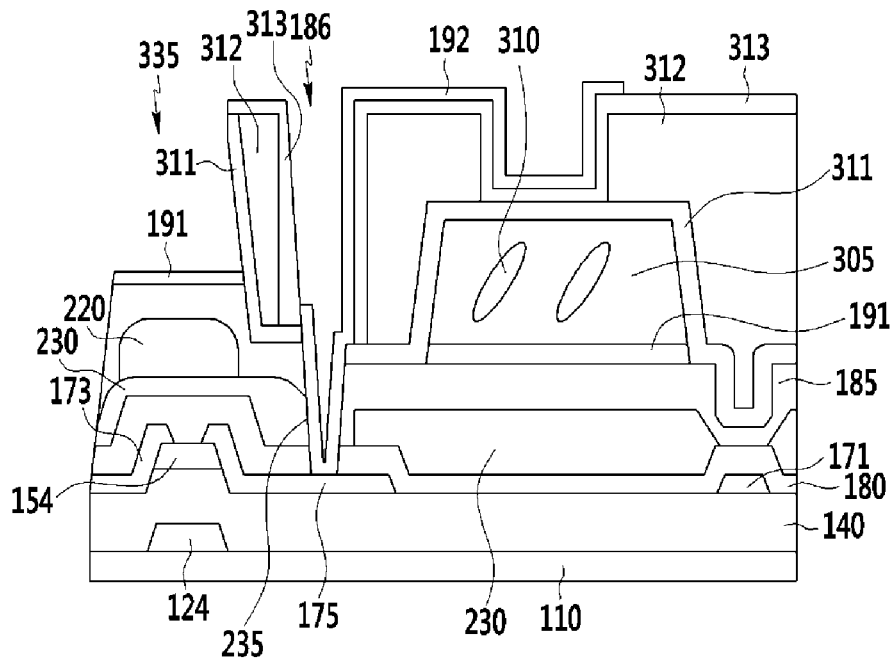
FIGS. 2, 3 and 4 are cross-sectional views taken along lines II-II, III-III and IV-IV of FIG. 1, respectively.
Figure 3:
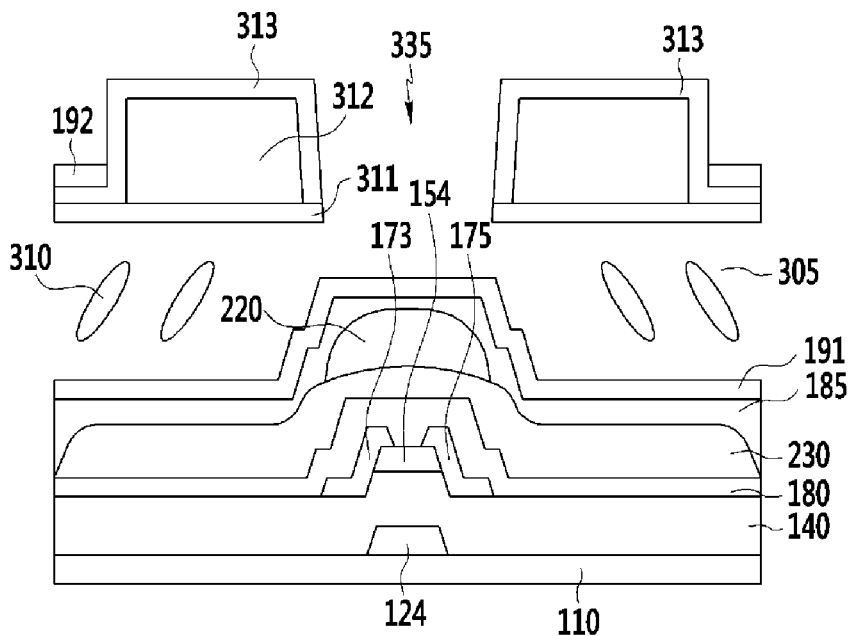
Figure 4:
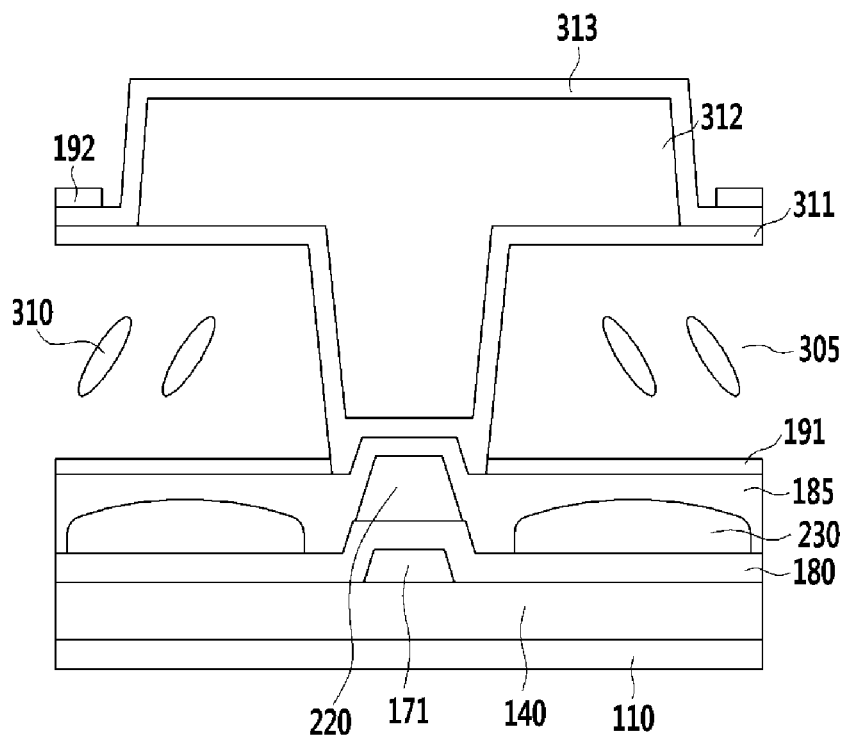
Figure 5:
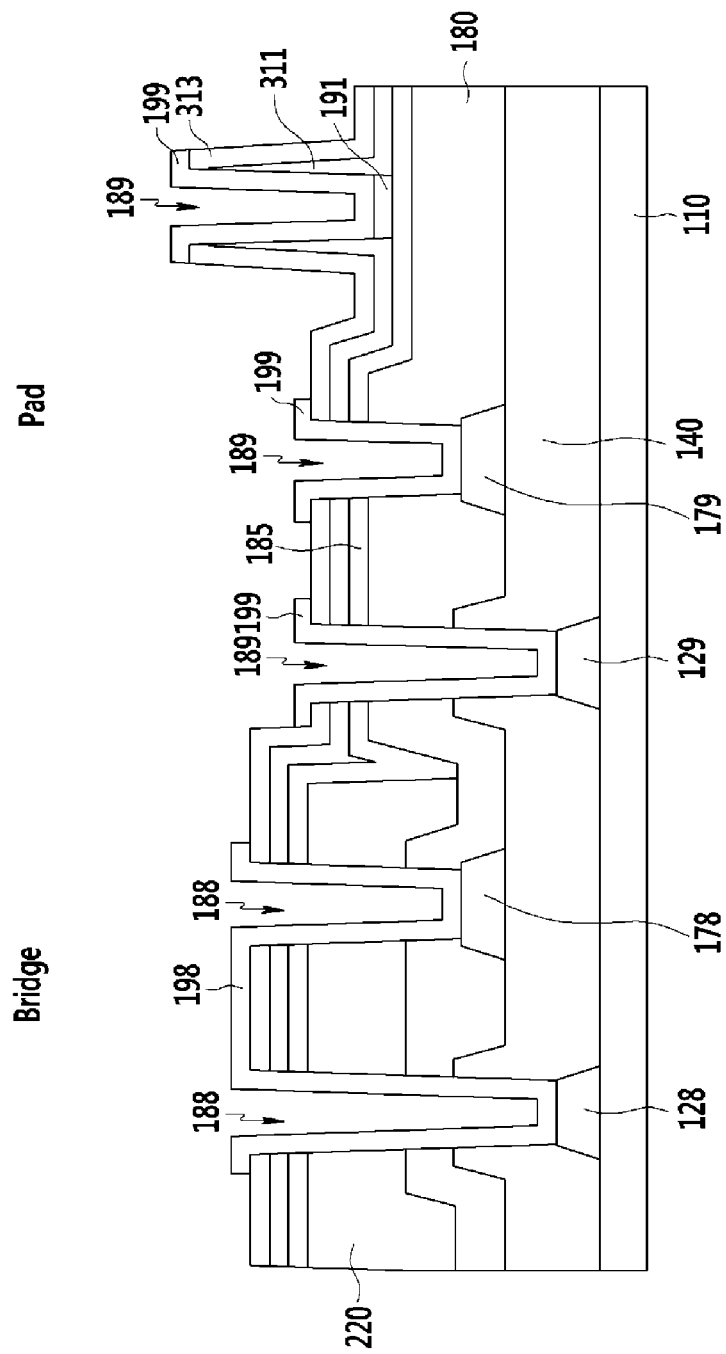
FIG. 5 is a cross-sectional view of a bridge region and a pad region in the liquid crystal display of FIG. 1.

FIG. 1 is a top plan view of an exemplary embodiment of a liquid crystal display according to the invention, FIGS. 2, 3 and 4 are cross-sectional views taken along lines II-II, III-III and IV-IV of FIG. 1, respectively, and FIG. 5 is a cross-sectional view of a bridge region and a pad region in the liquid crystal display of FIG. 1.

In an exemplary embodiment, a gate line 121 is provided, e.g., formed, on an insulating substrate 110 including transparent glass, plastics or the like. The gate line 121 extends substantially in a first direction, and includes a unidirectionally protruding gate electrode 124. In such an embodiment, a storage voltage line including a storage electrode may include substantially the same material as the gate line 121. The storage voltage line extends substantially in the first direction, and the storage electrode may protrude from the storage voltage line.

A gate insulating layer 140 is disposed on the gate line 121 and the insulating substrate 110. A semiconductor 154 that provides a channel of a thin film transistor is disposed on the gate insulating layer 140. In an exemplary embodiment, a semiconductor layer positioned may be further disposed at lower portions of a data line 171 and source and drain electrodes. In an exemplary embodiment, an ohmic contact may be disposed on the semiconductor 154 and between the source and drain electrodes.

A plurality of data lines 171 including the source electrode 173 and the drain electrode 175 are disposed on the semiconductor 154 and the gate insulating layer 140. The data lines 171 extend in a second direction. In the exemplary embodiment, the source electrode 173 has a horseshoe shape, and one end of the drain electrode 175 is surrounded by the source electrode having the horseshoe shape.

The gate electrode 124, the source electrode 173 and the drain electrode 175 collectively define a thin film transistor together with the semiconductor 154, and a channel of the thin film transistor is formed at the semiconductor portion 154 between the source electrode 173 and the drain electrode 175.

A first passivation layer 180 is disposed on data conductors 171, 173, and 175 and the exposed portion of the semiconductor 154. The first passivation layer 180 may include an inorganic insulator such as silicon nitride (SiNx) and silicon oxide (SiOx) or an organic insulator.

A color filter 230 and a light blocking member (e.g., a black matrix) 220 are disposed on the first passivation layer 180.

In an exemplary embodiment, the color filter 230 may display any one of primary colors such as three primary colors of red, green and blue colors. However, the color is not limited to the three primary colors of red, green and blue colors, and the color filter 230 may display any one of cyan, magenta, yellow, and white-based colors. In an exemplary embodiment, the color filter 230 having a same color extends along an extension direction of the data lines, which is a second direction, and along vertically adjacent pixels. In an alternative exemplary embodiment, color filters having the same color may be disposed along horizontally adjacent pixels, but not being limited thereto. In another alternative exemplary embodiment, color filters having different colors may be disposed along the vertically or horizontally adjacent pixels. In an exemplary embodiment, two adjacent color filters 230 may overlap each other. In an alternative exemplary embodiment, the two adjacent color filters 230 may be spaced from each other with a predetermined interval therebetween. In an exemplary embodiment, one color filter of the two color filters 230 may be positioned on the data line 171. A contact hole 235 formed in a region, through which the drain electrode 175 is to be exposed, is formed in the color filter 230.

The light blocking member 220 having a lattice structure, which includes an opening corresponding to a region for displaying an image, is disposed on the color filter 230. The light blocking member 220 includes a material that blocks light, and positioned on an upper portion of at least a partial region of the gate line 121, the data line 171 and the thin film transistor to block light. In an exemplary embodiment, the color filter 230 is positioned in the opening of the light blocking member 220. In such an embodiment, the contact hole 235 of the color filter 230 is positioned in the opening of the light blocking member 220 such that the color filter 230 does not overlap the region through which the drain electrode 175 is to be exposed. In an alternative exemplary embodiment, the light blocking member 220 may be positioned on an upper portion of the drain electrode 175, and the contact hole may be formed on the corresponding portion.

A second passivation layer 185 is disposed on the color filter 230 and the light blocking member 220, and covers the color filter 230 and the light blocking member 220. The second passivation layer 185 may include an inorganic insulator such as silicon nitride (SiNx) and silicon oxide (SiOx) or an organic insulator. In an exemplary embodiment, where a step occurs due to a difference in thickness of the color filter 230 and the light blocking member 220, the second passivation layer 185 include the organic insulator to substantially reduce or effectively remove the step.

A contact hole 186, through which one end (extended portion) of the drain electrode 175 is exposed, is formed in the first and second passivation layers 180 and 185. The contact hole 186 of the first and second passivation layers 180 and 185 is formed at a position overlapping the contact hole 235 of the color filter 230, thereby exposing the extended portion of the drain electrode 175.

A common electrode 191, to which a common voltage is applied, is disposed on the second passivation layer 185. The common electrode 191 may be formed of a transparent conductive material such as indium tin oxide ("ITO") or indium zinc oxide ("IZO"). In an exemplary embodiment, the common electrode 191 extends in the second direction (data line direction), and the horizontally adjacent pixels are not connected to each other. In such an embodiment, the common electrodes 191 may be connected to each other outside the display region, and a same common voltage may be applied thereto. In an exemplary embodiment, as shown in FIG. 1, the common electrode 191 is not disposed on the region, through which the contact hole 186 is formed, in a pixel region or a region through which the drain electrode 175 is to be exposed (hereinafter, referred to as "drain electrode exposing region"), and may not be disposed on an upper portion of at least a portion of the data lines 171 (e.g., region between microcavity layers).

In an exemplary embodiment, a connection portion (not shown) for connecting the common electrodes 191 of the horizontally adjacent pixels to each other may be further included. The connection portion of the common electrode may be disposed crossing the data line 171.

A microcavity layer 305 is disposed on an upper portion of the common electrode 191 positioned in the pixel region. In an exemplary embodiment, the common electrode 191 is etched using a sacrificial layer 300 disposed on an upper surface of the microcavity layer 305 as a mask (see FIGS. 15A to 15D), and at least one side of the common electrode is aligned with the corresponding side of the microcavity layer 305. In an exemplary embodiment, liquid crystal injection holes 335 are formed above and below the pixel, upper and lower sides of the common electrode 191 are not aligned with upper and lower sides of the microcavity layer 305 but right and left sides thereof (sides adjacent to the data lines 171) are aligned therewith. (See FIG. 2) In such an embodiment, both sides of the common electrode 191, which extend in the second direction, are aligned with the sides of the microcavity layer 305. In such an embodiment, at least one side of the common electrode 191 may be aligned with one corresponding side of the microcavity layer 305 even around the drain electrode exposing region.

In an exemplary embodiment, a liquid crystal layer including liquid crystal molecules 310 is disposed inside the microcavity layer 305. In such an embodiment, an alignment layer (not shown) may be provided in the microcavity layer 305 to align the liquid crystal molecules 310. The alignment layer may include at least one of materials generally-used as a liquid crystal alignment layer, such as polyamic acid, polysiloxane or polyimide, for example, but not being limited thereto.

In an exemplary embodiment, the cross-section of the microcavity layer 305 has a trapezoidal shape, and may have a liquid crystal injection hole 335 on one side thereof such that liquid crystal may be injected there into. In an exemplary embodiment, the liquid crystal molecules 310 are inserted through the liquid crystal injection hole 335 into the microcavity layer 305 by capillary force, and the alignment layer may be formed by the capillary force. In such an embodiment, a structure, e.g., a sealing member, may be further included such that the liquid crystal material is effectively prevented from being discharged through the liquid crystal injection hole 335 after the liquid crystal material is injected.

A first upper insulating layer 311 is positioned on the second passivation layer 185, the microcavity layer 305 and the common electrode 191. The first upper insulating layer 311 may include an inorganic insulating material such as silicon nitride (SiNx), and be disposed overlapping substantially an entire surface of the substrate.

A roof layer 312 is disposed on the first upper insulating layer 311. The roof layer 312 supports the microcavity layer 305. In an exemplary embodiment, an opening 312' is defined in the roof layer 312 in a region in which the liquid crystal injection hole 335 is to be formed (hereinafter, referred to as "liquid crystal injection hole forming region"), a region through which the drain electrode 175 is to be exposed (i.e., a region in which the contact hole 186 is formed, and hereinafter, referred to as "drain electrode exposing region") and a region in which the pixel electrode 192 that receives a data voltage is to be disposed (hereinafter, "pixel electrode region"). In an exemplary embodiment, the opening 312' of the roof layer 312 may include a connection opening 312' through which the opening of the drain electrode exposing region and the opening of the pixel electrode region are connected. The roof layer 312 may include an organic material.

A second upper insulating layer 313 is disposed on the roof layer 312. The second upper insulating layer 313 may include an inorganic insulating material such as silicon nitride (SiNx), and be disposed overlapping substantially the entire surface of the substrate.

The pixel electrode 192 is disposed on the opening 312' of the pixel electrode region, the opening 312' of the drain electrode exposing region, the connection opening 312' through which the openings are connected, and the second upper insulating layer 313. The pixel electrode 192 may be partially positioned on the roof layer 312 to cover the opening 312' of the pixel electrode region, the opening 312' of the drain electrode exposing region and the connection opening 312' through which the openings are connected. In an exemplary embodiment, the pixel electrode 192 may be formed only on the opening 312' of the pixel electrode region, the opening 312' of the drain electrode exposing region and the connection opening 312' through which the openings are connected, and may not be formed on the roof layer 312. The pixel electrode 192 is electrically connected to the drain electrode 175 exposed in the drain electrode exposing region, and receives a data voltage. An electric field is generated by the pixel electrode 192 receiving a data voltage and the common electrode 191 receiving a common voltage, and an alignment direction of the liquid crystal molecules 310 is changed by the electric field. The pixel electrode 192 may include a transparent conductive material such as ITO or IZO.

In an exemplary embodiment, the common electrode 191 or the pixel electrode 192 may include domain division means such as a groove or a protrusion. In such an embodiment, the common electrode 191 or the pixel electrode 192 may have a horizontal or vertical stem portion and a fine branch portion extending from the horizontal or vertical stem portion.

The first upper insulating layer 311, the roof layer 312 and the second upper insulating layer 313 serve to support the microcavity layer. In an exemplary embodiment, the roof layer 312 is the thickest among the first upper insulating layer 311, the roof layer 312 and the second upper insulating layer 313, and substantially supports the microcavity layer 305. In an alternative exemplary embodiment, the first upper insulating layer 311 and the second upper insulating layer 313 may be omitted.

A polarizer (not shown) is positioned on a lower portion of the insulating substrate 110 and upper portions of the second upper insulating layer 313 and the pixel electrode 192. The polarizer may include a polarization element for polarization and a tri-acetyl-cellulose ("TAC") layer to improve durability. In an exemplary embodiment, directions of transmissive axes of an upper polarizer and a lower polarizer may be substantially vertical or parallel to each other.

FIG. 5 shows cross-sections of a region in which a bridge is provided and a region in which a plurality of pads are disposed in peripheral regions outside the display region of an exemplary embodiment of the display panel. In an exemplary embodiment, as shown in FIG. 5, a plurality of pad holes 189 are formed in the peripheral regions to expose an extended portion 129 disposed outside the gate line 121, a pad 199 connected to an extended portion 179 disposed outside the data line 171 and a pad 199 that applies a common voltage to the common electrode 191. In such an embodiment a plurality of bridge holes 188 are formed to expose a portion 128 of a wiring disposed in the same layer as the gate line 121, and a portion 178 of a wiring disposed in the same layer as the data line 171 to each other. The pads include a pad 199 connected to the extended portion 129 disposed outside the gate line 121, a pad 199 connected to the extended portion 179 disposed outside the data line 171, and a pad 199 that applies a common voltage to the common electrode 191. The bridge 198 connects the portion 128 of a wiring disposed in the same layer as the gate line and the portion 178 of a wiring disposed in the same layer as the data line to each other.

In an exemplary embodiment, one pixel may be divided into two subpixels, and each subpixel may include the thin film transistor and the pixel electrode 192.

Hereinafter, an exemplary embodiment of a method of manufacturing the liquid crystal display according to the invention will be described through FIGS. 6 to 19.

FIGS. 6 to 19 are views illustrating an exemplary embodiment of a method of manufacturing the liquid crystal display according to the invention.

Figure 6:
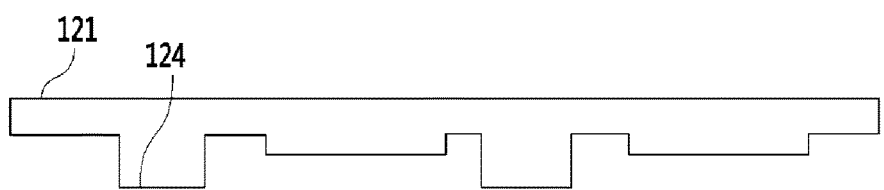
FIGS. 6 to 19 are views illustrating an exemplary embodiment of a method of manufacturing the liquid crystal display in FIGS. 1 to 5 according to the invention.
Figure 6:
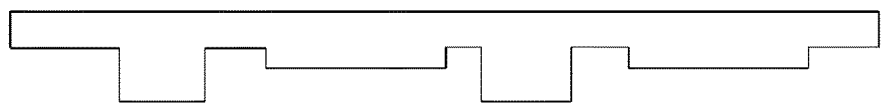

First, FIG. 6 is a top plan view of the gate line 121 provided on the insulating substrate 110.

Referring back to FIG. 3, the gate line 121 is provided, e.g., formed, on the insulating substrate 110 including transparent glass, plastics or the like. The gate line 121 includes the protruding gate electrode 124, and extends in the first direction. In an exemplary embodiment, a storage voltage line may include substantially the same material as the gate line.

A gate insulating layer 140 covering the gate line 121 and the insulating substrate 110 is provided on the gate line 121 and the insulating substrate 110.

Figure 7:
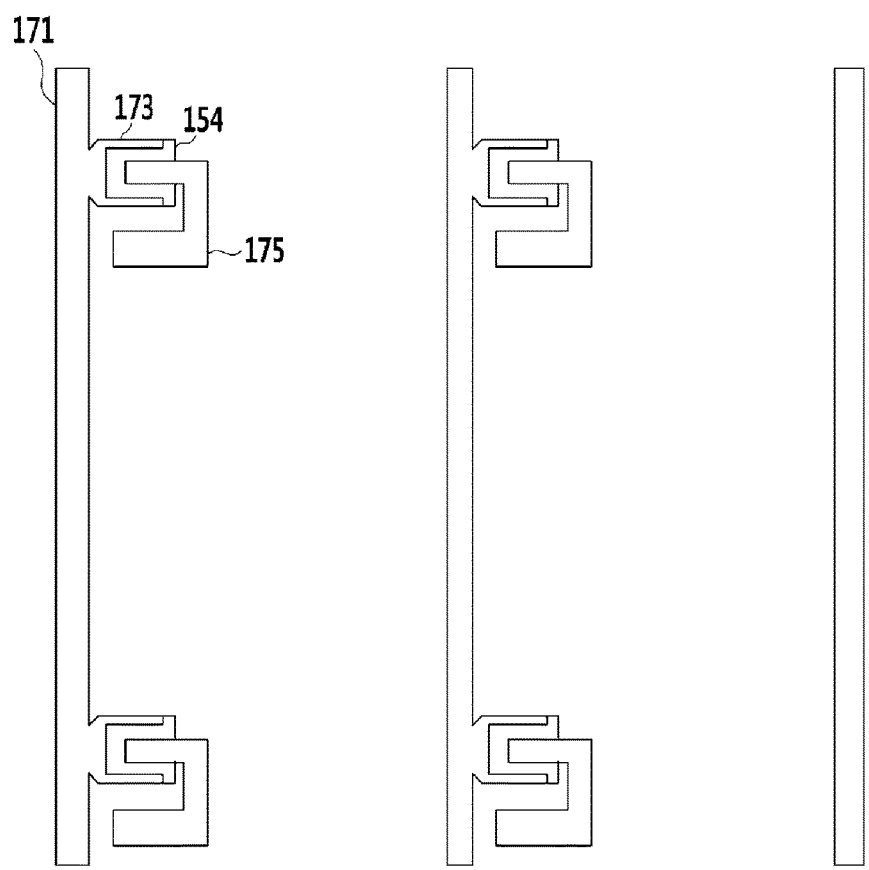
Figure 8A:
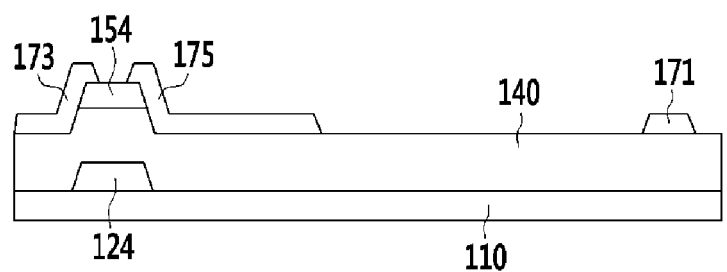
Figure 8B:
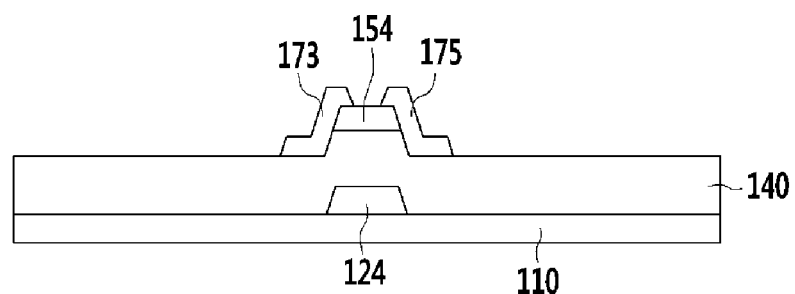
Figure 8C:
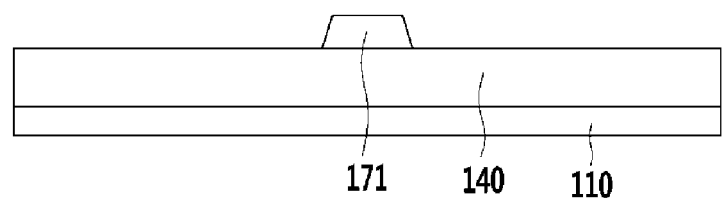

Thereafter, as shown in FIGS. 7 to 8D, the semiconductor 154, the data line 171 and the source and drain electrodes 173 and 175 are provided on the gate insulating layer 140.

FIG. 7 is a top plan view of the semiconductor 154 and the data conductors 171, 173 and 175 provided on the insulating substrate 110, and FIGS. 8A to 8D are cross-sectional views corresponding to FIGS. 2 to 5.

In an exemplary embodiment, the semiconductor material is provided, e.g, laminated, and exposed and developed by the mask to form the semiconductor 154. Thereafter, a material for a data conductive layer is provided, e.g., laminated, and exposed and developed by another mask to form the data conductors 171, 173 and 175 such that two masks are used to provide the semiconductor 154 and the data conductors 171, 173, and 175.

In an alternative exemplary embodiment, the semiconductor material and the material for the data conductive layer may be sequentially provided, e.g., laminated, and then exposed, developed and etched through a same mask (e.g., a slit mask or a transflective mask) by one process to provide two patterns together. In such an embodiment, exposure is performed while the corresponding portion corresponds to the slit of the mask or the transflective region such that the semiconductor 154 positioned at the channel portion of the thin film transistor is effectively prevented from being etched. In an exemplary embodiment, the semiconductor layer is also provided on lower portions of the data conductors 171, 173 and 175.

In an exemplary embodiment, an ohmic contact may be disposed on the semiconductor 154 and between the source electrode 173 and the drain electrode 175.

The first passivation layer 180 is disposed on and overlapping substantially the entire region of the data conductors 171, 173 and 175 and the exposed semiconductor portion 154. The first passivation layer 180 may include an inorganic insulator such as silicon nitride (SiNx) and silicon oxide (SiOx) or an organic insulator.

Figure 9:
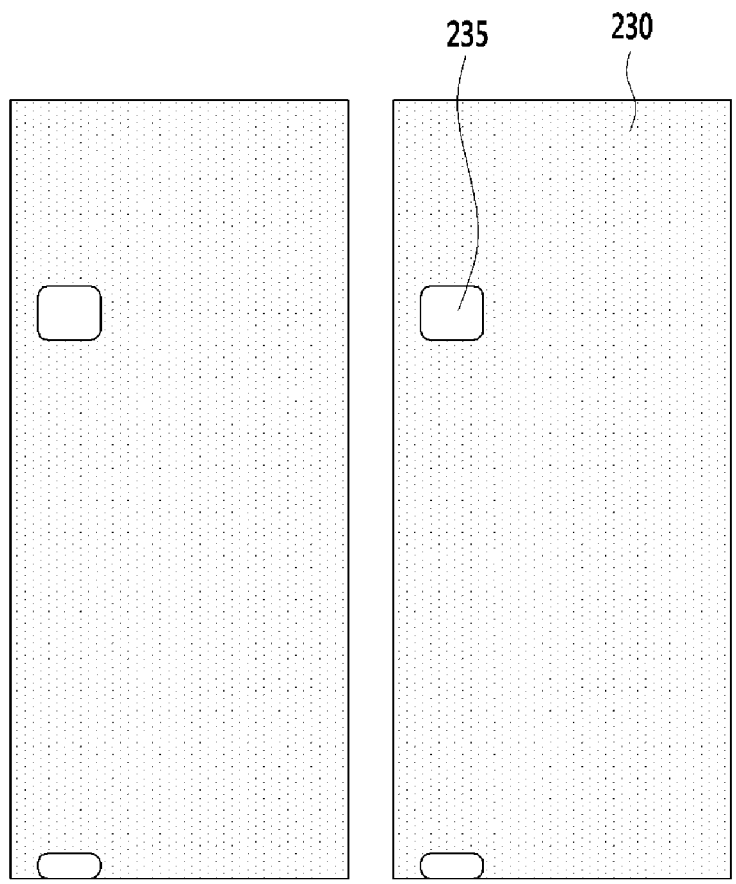

In an exemplary embodiment, as shown in FIG. 9, the color filter 230 is disposed on the first passivation layer 180. The color filter 230 may display any one of primary colors such as three primary colors of red, green and blue colors. In such an embodiment, a process for providing the color filter 230 should be performed for each of three primary colors. In such an embodiment where the three primary colors are used, the process for providing the color filter 230 is performed three times. In an exemplary embodiment, the color filter 230 having a same color is provided to extend along an extension direction of the data lines, that is the second direction, overlapping the vertically adjacent pixels adjacent. In an alternative exemplary embodiment, the color filters having the same color may be provided overlapping the horizontally adjacent pixels adjacent right and left in the first direction. In another alternative exemplary embodiment, the color filters having different colors may be provided for vertically or horizontally adjacent pixels. Two adjacent color filters 230 may overlap each other or be spaced apart from each other with a predetermined interval therebetween. In an exemplary embodiment, one color filter of the two adjacent color filters may be positioned overlapping the data line 171. The contact hole 235 formed in the region through which the drain electrode 175 is to be exposed is formed together with the color filter 230 in the process for providing the color filter 230.

Figure 10:
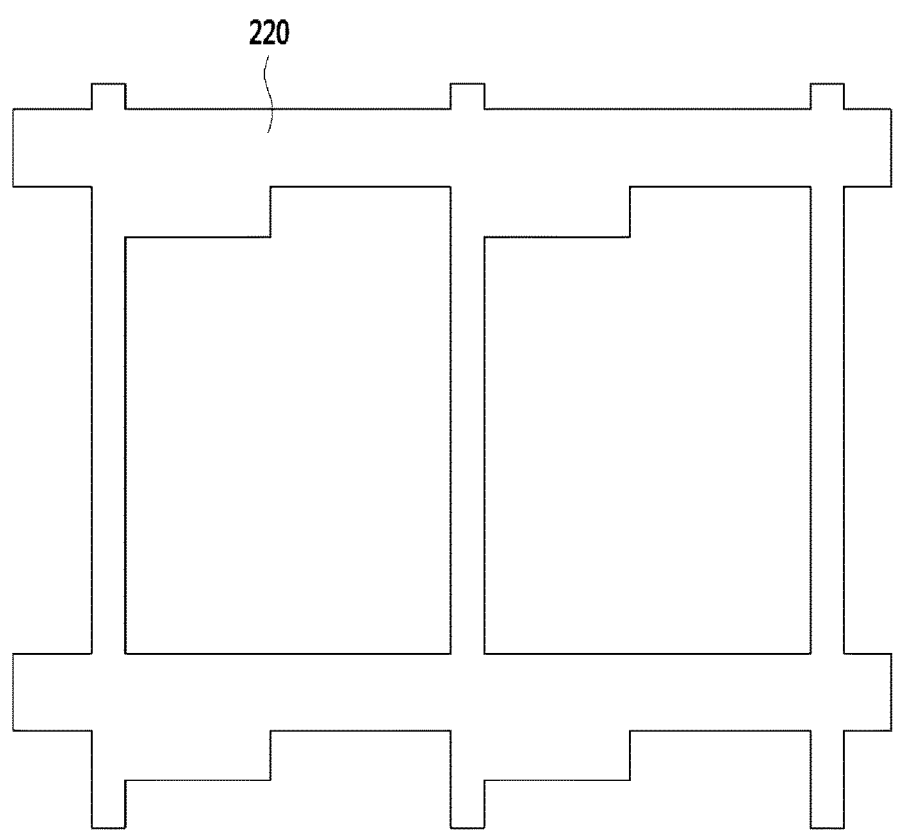
Figure 11A:
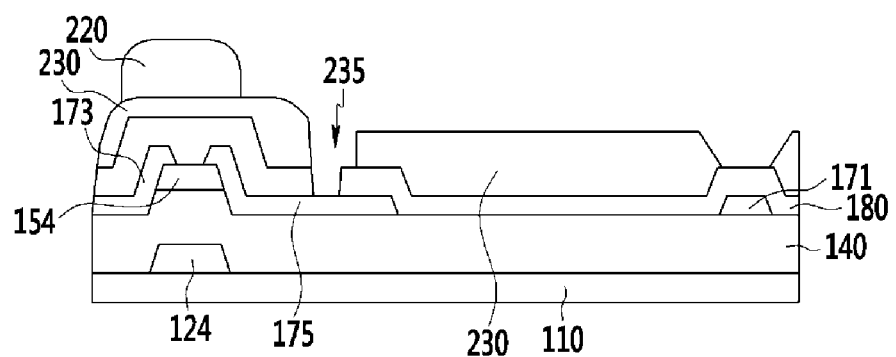
Figure 11B:
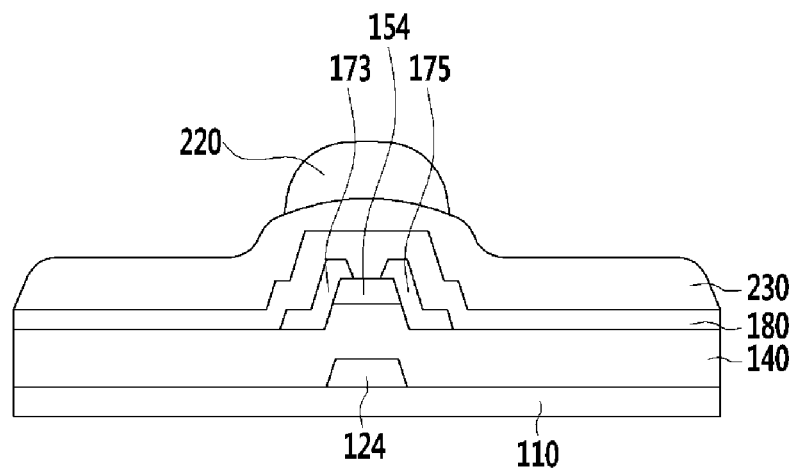
Figure 11C:
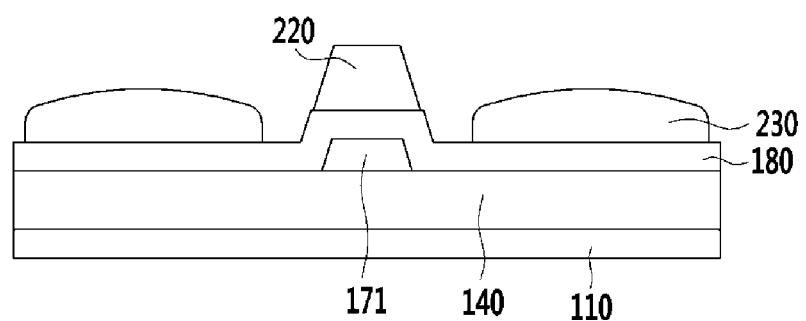
Figure 11D:
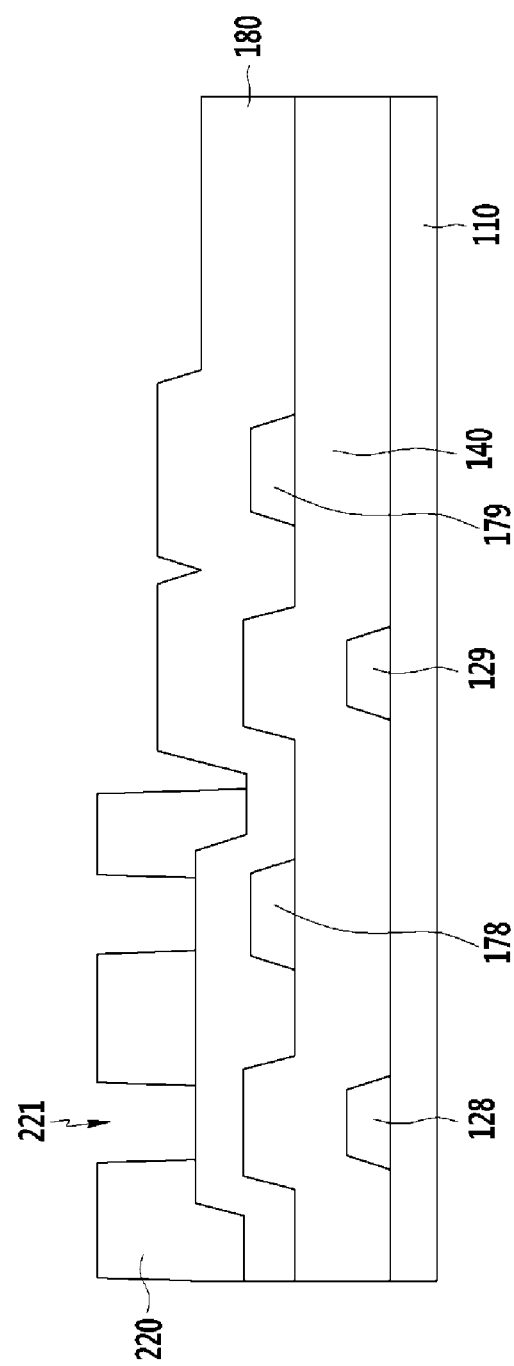
Figure 12A:
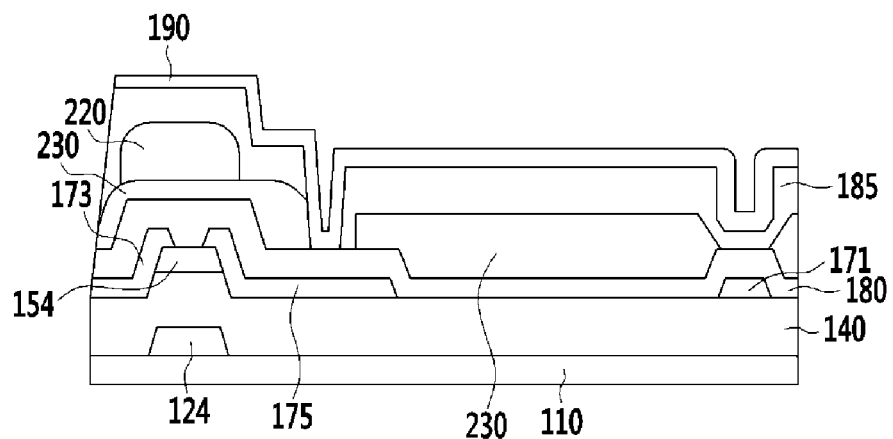
Figure 12B:
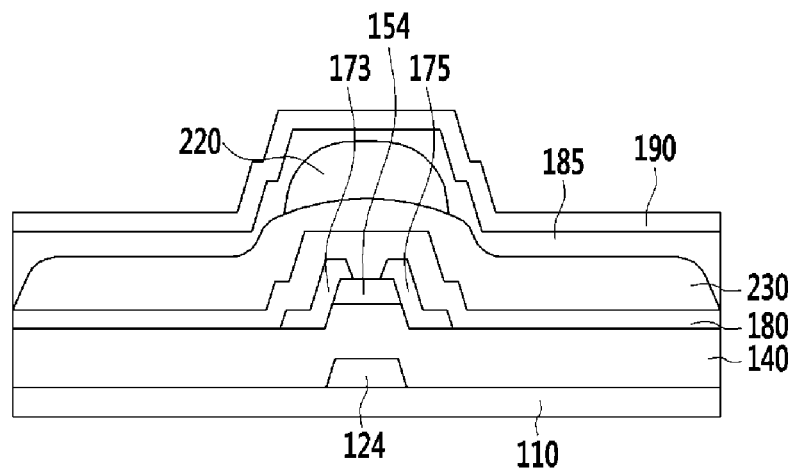
Figure 12C:
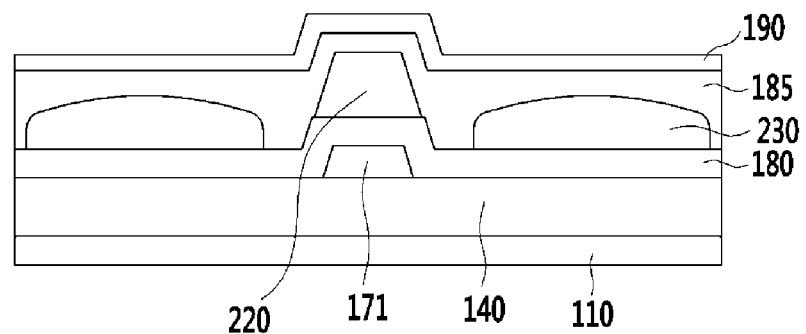
Figure 12D:
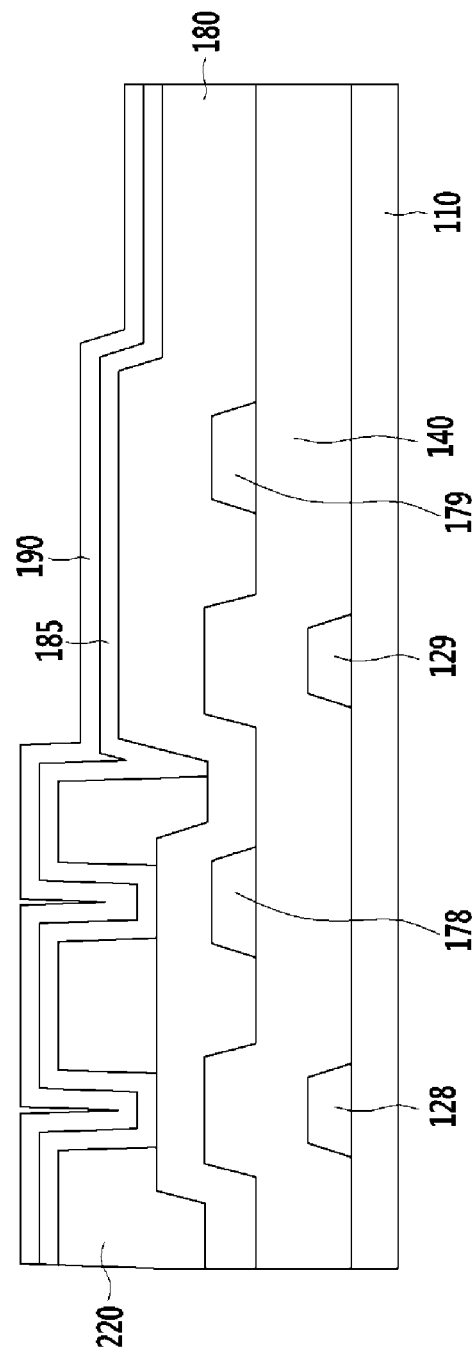

Thereafter, as shown in FIGS. 10 to 11D, the light blocking member (black matrix) 220 is provided. FIGS. 11A to 11D are cross-sectional views corresponding to FIGS. 2 to 5. The light blocking member 220 is provided to have a lattice structure having the opening corresponding to the region for displaying an image, and of the light blocking member 220 includes a material that blocks light. The light blocking member 220 is positioned on an upper portion of at least a partial region of the gate line 121, the data line 171 and the thin film transistor to effectively prevent light from leaking around the gate line 121, the data line 171 and the thin film transistor. The color filter 230 is positioned in the opening of the light blocking member 220. In an exemplary embodiment, the contact hole 235 of the color filter 230 is positioned in the opening of the light blocking member 220. In such an embodiment, the contact hole may be provided during a subsequent process, and the light blocking member 220 is effectively removed on the region through which the drain electrode 175 is to be exposed. In an alternative exemplary embodiment, the light blocking member 220 may be positioned on the upper portion of the drain electrode 175, and the contact hole may be formed in the corresponding portion. In an exemplary embodiment, as shown in FIG. 11D, contact holes 221 are formed in the light blocking member 220 in the peripheral region, in which the bridge is provided.

Thereafter, as shown in FIGS. 12A to 12D, the second passivation layer 185 is provided on substantially the entire region of the color filter 230 and the light blocking member 220. FIGS. 12A to 12D are cross-sectional views corresponding to FIGS. 2 to 5. The second passivation layer 185 may include an inorganic insulator such as silicon nitride (SiNx) and silicon oxide (SiOx) or an organic insulator.

Thereafter, the transparent conductive material 190 such as ITO or IZO is provided, e.g., laminated, on substantially the entire region of the second passivation layer 185. In an alternative exemplary embodiment, where the liquid crystal display is a reflective type liquid crystal display, a conductive material that reflects light may be provided on the second passivation layer 185.

In such an embodiment, as shown in FIGS. 12A to 12D, the contact hole 186 is not directly formed in the passivation layers 180 and 185 using a separate mask, and the pattern is not formed by the transparent conductive material 190 using a separate mask, and the number of the masks used in the method is thereby substantially reduced.

Figure 13:
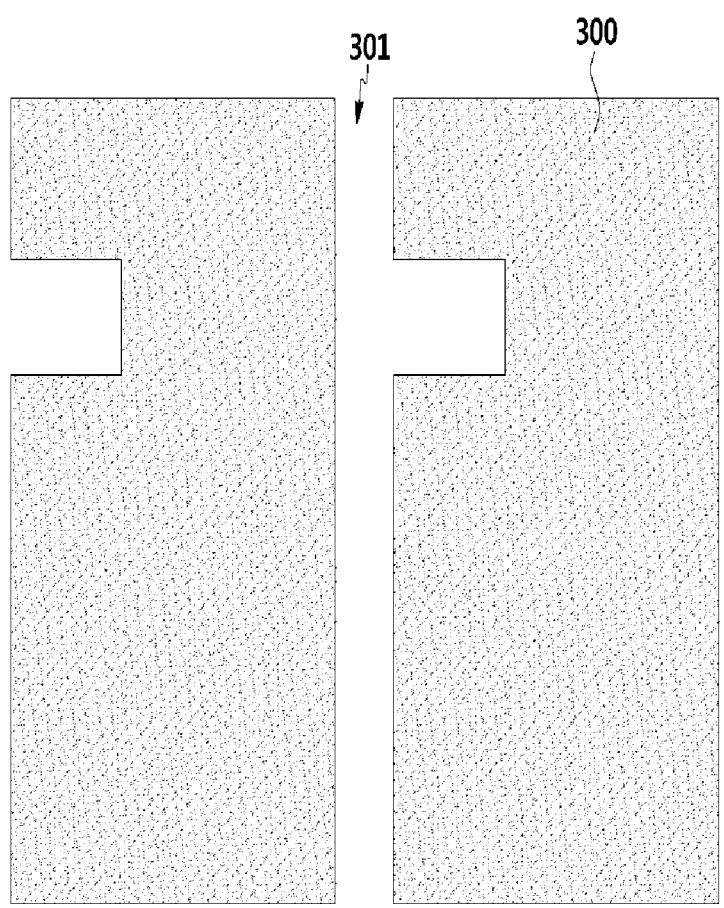
Figure 14A:
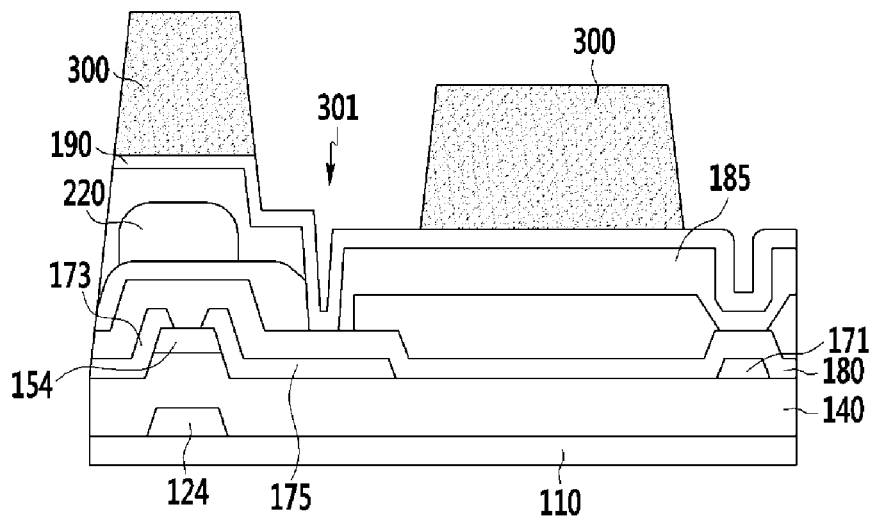
Figure 14B:
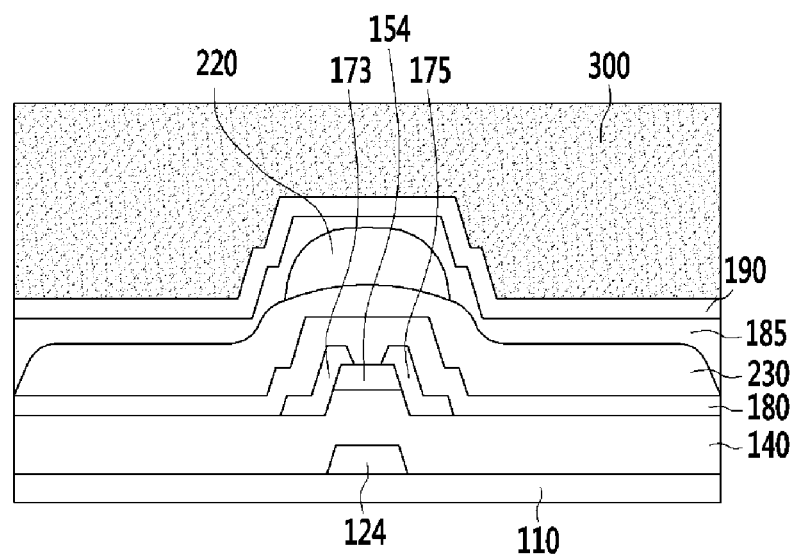
Figure 14C:
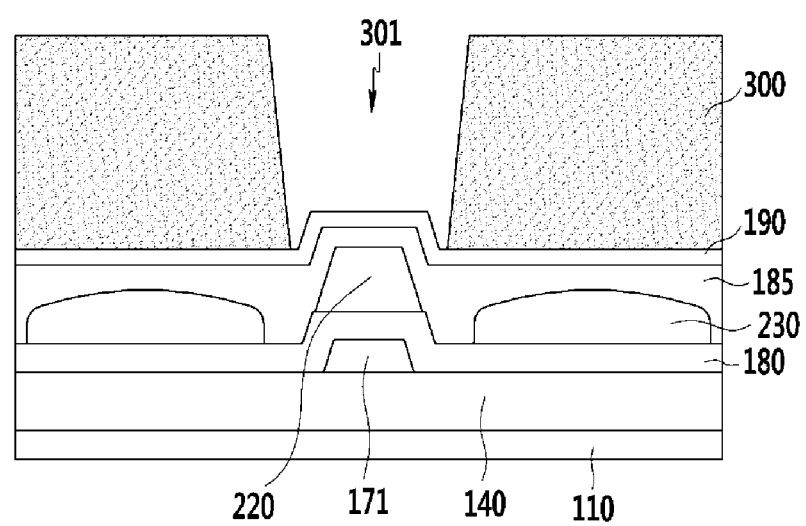
Figure 15A:
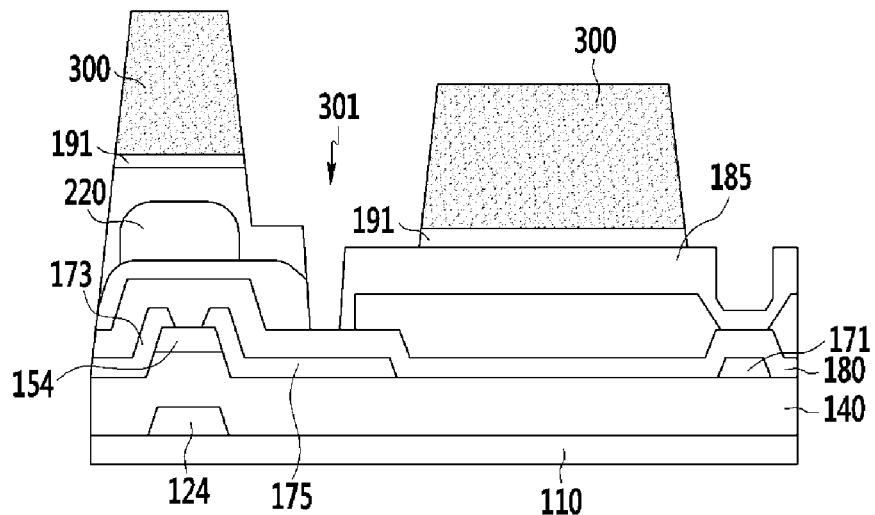
Figure 15B:
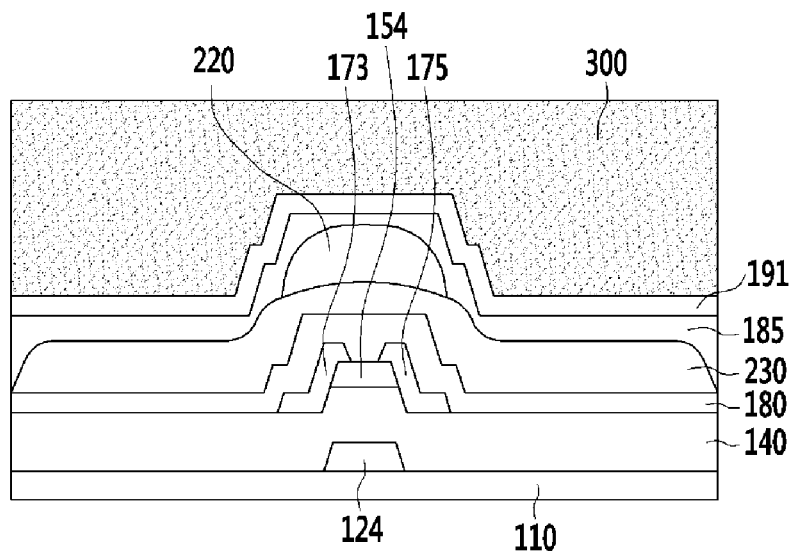
Figure 15C:
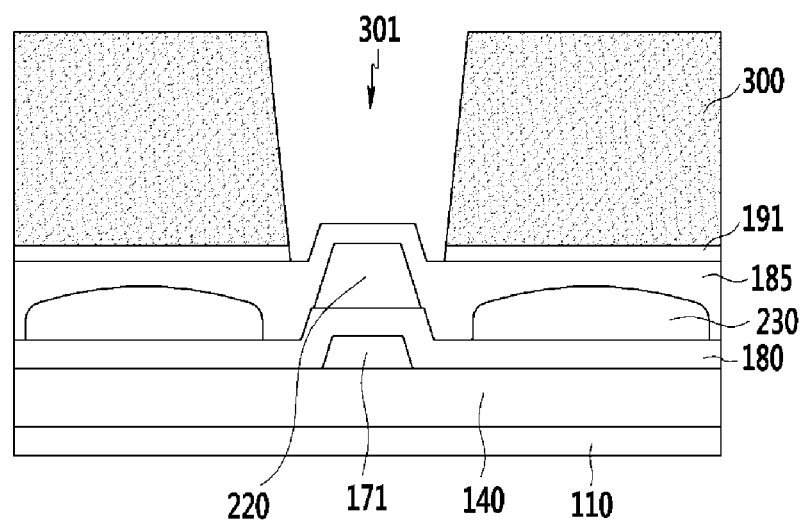
Figure 15D:
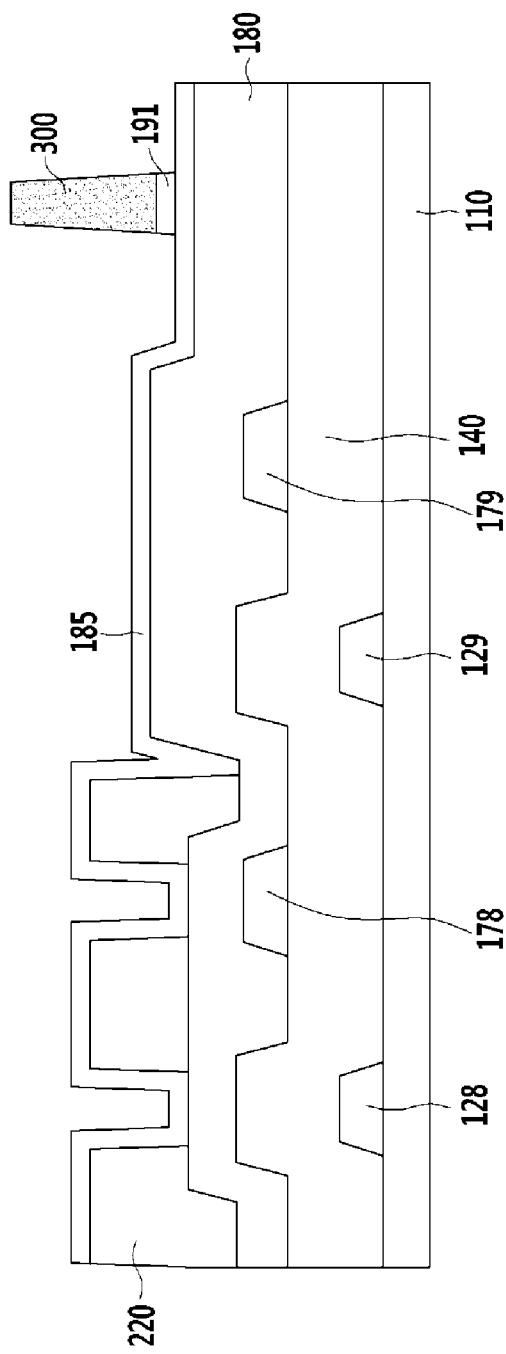

Thereafter, as shown in FIGS. 13 to 14D, the sacrificial layer 300 having the opening 301 is provided. FIGS. 14A to 14D are cross-sectional views corresponding to FIGS. 2 to 5. The sacrificial layer 300 may include an organic material such as photoresist. In such an embodiment, the sacrificial layer 300 is provided at a position at which the microcavity layer 305 is to be provided and removed after the microcavity layer is provided. The sacrificial layer 300 extends substantially in the second direction (the data line direction), and the opening 301 of the sacrificial layer 300 is positioned in the region between the adjacent microcavity layers and the drain electrode exposing region. In such an embodiment, the sacrificial layer 300 is not provided in an upper region of the data line 171, and in an upper portion of a partial region of the drain electrode that is an output terminal of the thin film transistor.

In an exemplary embodiment, referring to FIG. 14D, the pads are provided on the wiring (for example, common voltage application wiring), which is provided on the layer of the transparent conductive material 190 in the peripheral region, and the sacrificial layer 300 is provided in the region in which the pads are to be provided. In an alternative exemplary embodiment, the pad may be provided to be directly connected to the wiring on the layer of the transparent conductive material 190.

Thereafter, as shown in FIGS. 15A to 15D, the exposed transparent conductive material 190 is etched using the sacrificial layer 300 as a mask to form the common electrode 191. FIGS. 15A to 15D are cross-sectional views corresponding to FIGS. 2 to 5.

In an exemplary embodiment, a process of providing the sacrificial layer 300 having the opening 301 of FIGS. 13 to 14D and a process of providing the common electrode 191 of FIGS. 15A to 15D may be performed together. In such an embodiment, when patterning is performed to form the opening 301 in the sacrificial layer 300, the transparent conductive material 190 at a lower portion thereof may be patterned.

Thereafter, the first upper insulating layer 311 is formed of the inorganic insulating material such as silicon nitride (SiNx) on the entire region of the display panel. FIGS. 17A to 17D are cross-sectional views corresponding to FIGS. 2 to 5.

Figure 16:
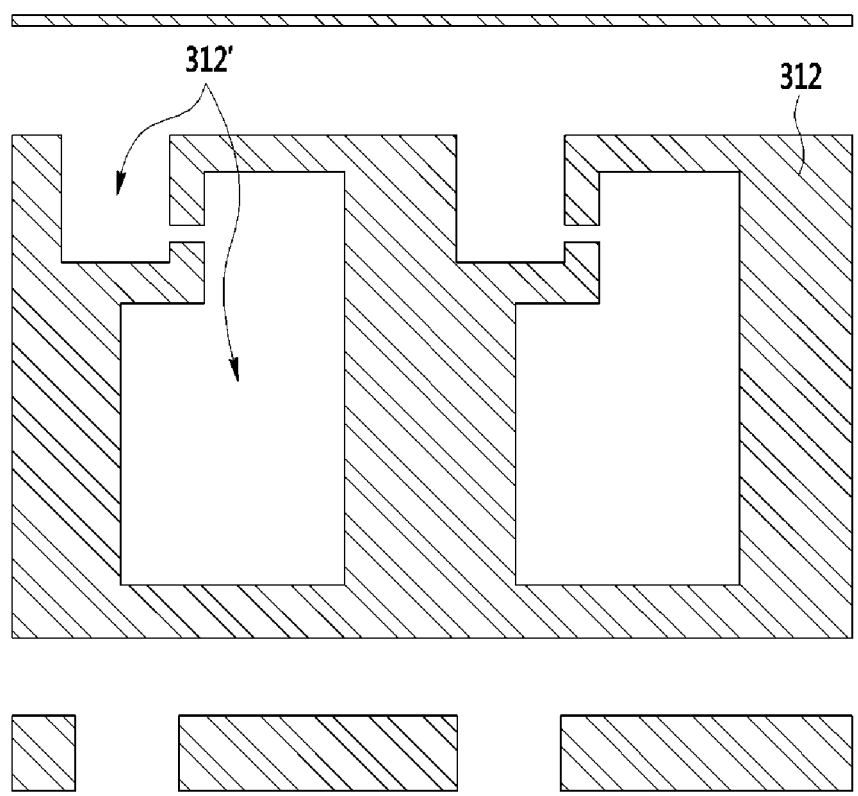
Figure 17A:
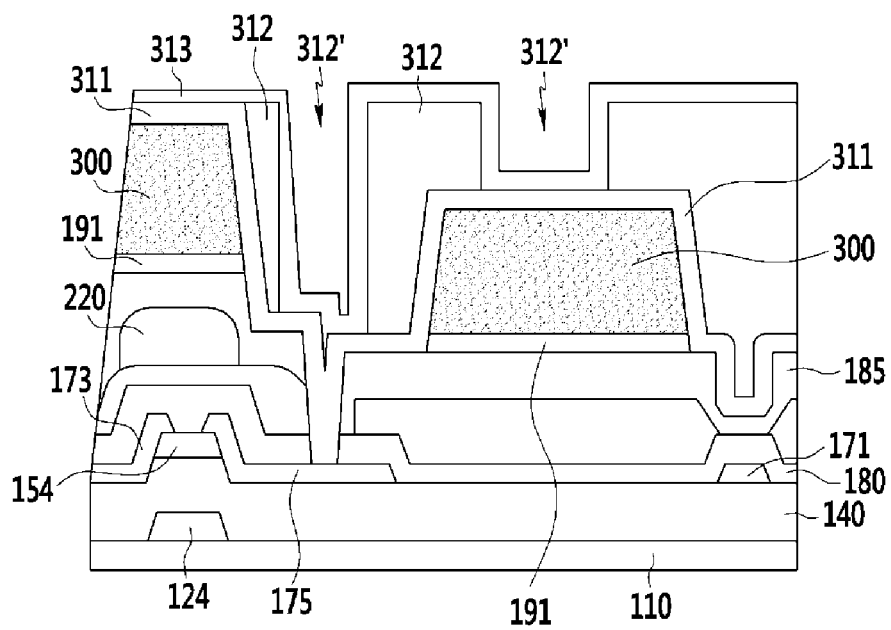
Figure 17B:
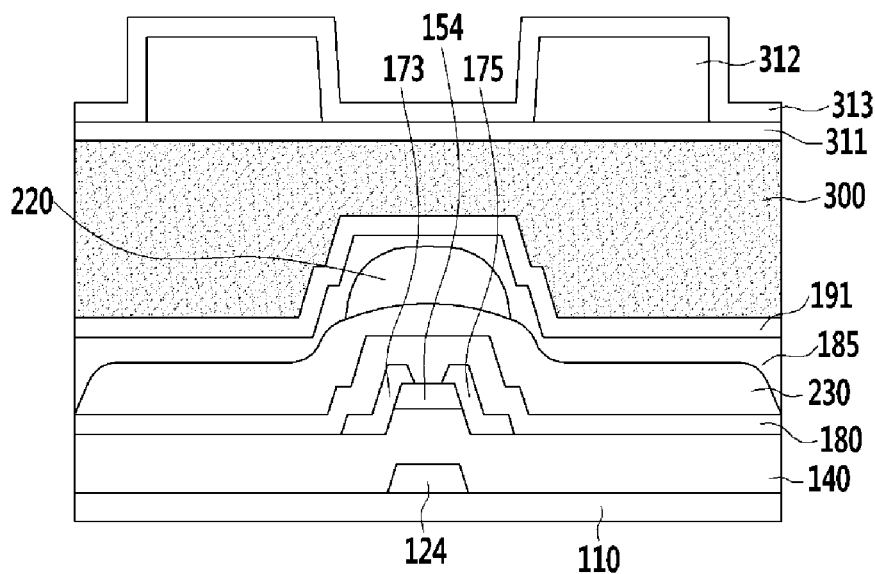
Figure 17C:
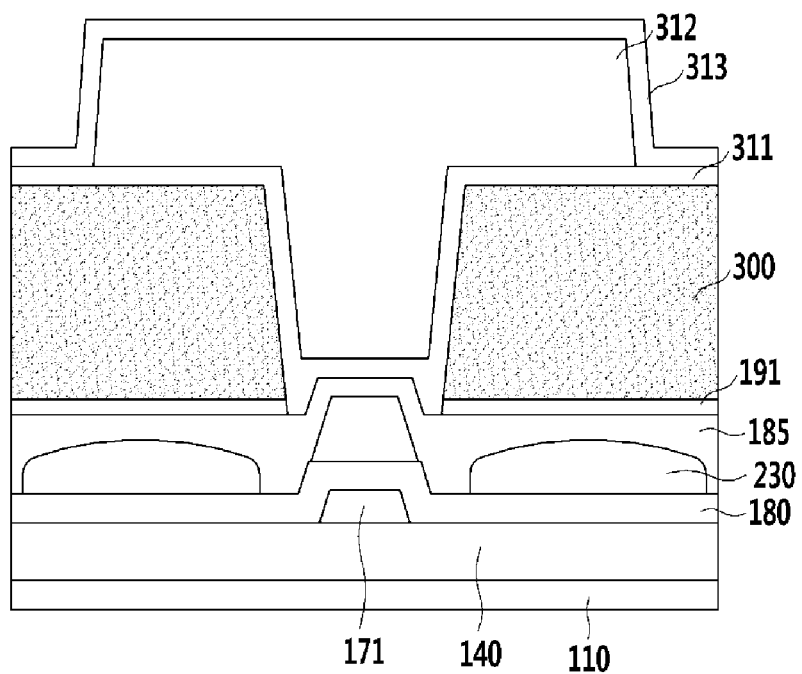
Figure 17D:
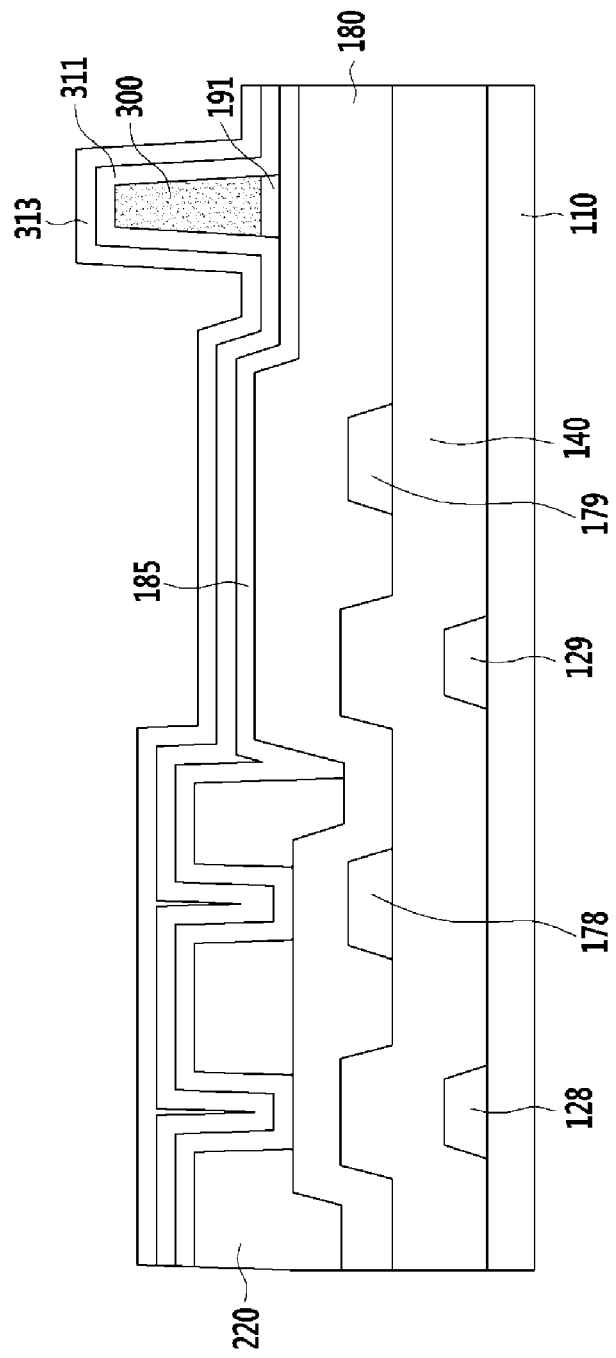

Thereafter, as shown in FIGS. 16 to 17D, the roof layer 312 having the opening 312' is provided in the region in which the liquid crystal injection hole 335 is to be formed (liquid crystal injection hole forming region), the region through which the drain electrode 175 is to be exposed (region in which the contact hole 186 is to be formed; drain electrode exposing region) and the region in which the pixel electrode 192 that receives a data voltage is to be provided (pixel electrode region). In such an embodiment, the opening 312' of the roof layer 312 may further include a connection opening 312' through which the opening of the drain electrode exposing region and the opening of the pixel electrode region are connected. The roof layer 312 may include the organic insulating material, and the thickness of the roof layer 312 may be greater than a thickness of the first upper insulating layer 311.

Thereafter, the second upper insulating layer 313 is provided on the roof layer 312. The second upper insulating layer 313 may include the inorganic insulating material such as silicon nitride (SiNx), and the second upper insulating layer 313 is provided on substantially the entire substrate. The second upper insulating layer 313 and the first upper insulating layer 311 may include a same material.

In such an embodiment, the first upper insulating layer 311, the roof layer 312 and the second upper insulating layer 313 serve to support the microcavity layer, and the roof layer 312 that is the thickest among the first upper insulating layer 311, the roof layer 312 and the second upper insulating layer 313 substantially supports the microcavity layer 305. In an alternative embodiment, the first upper insulating layer 311 and the second upper insulating layer 313 may be omitted. In an exemplary embodiment, referring to FIG. 17D, the roof layer 312 is not provided in the bridge region and the pad region, and the microcavity portion 305 is not provided in the bridge region and the pad region. In an alternative exemplary embodiment, the roof layer 312 may be provided in the bridge region and the pad region.

Figure 18A:
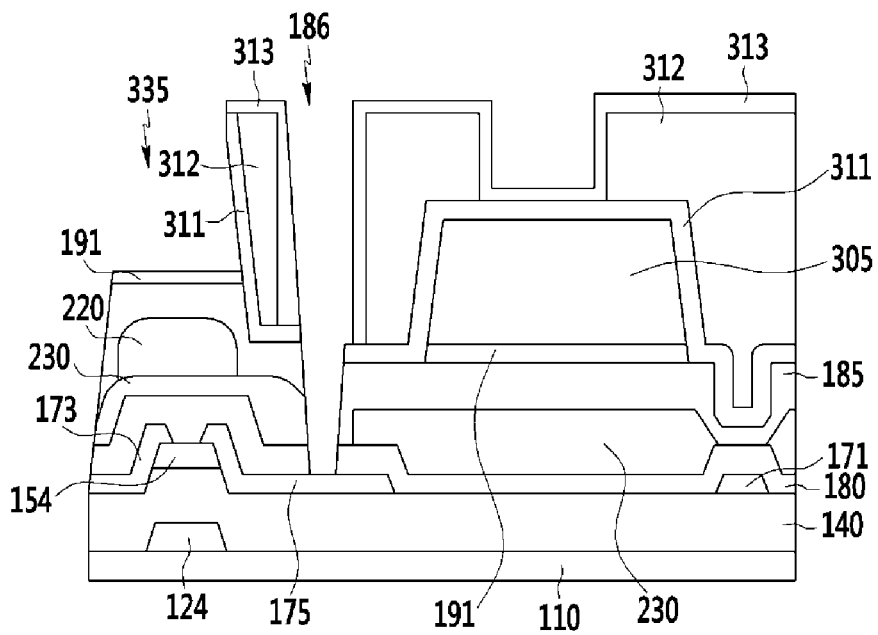
Figure 18B:
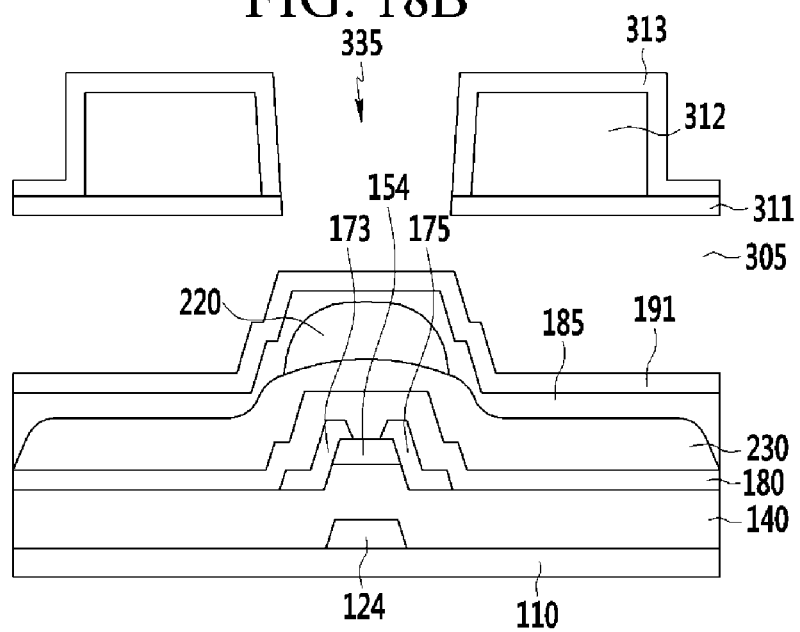
Figure 18C:
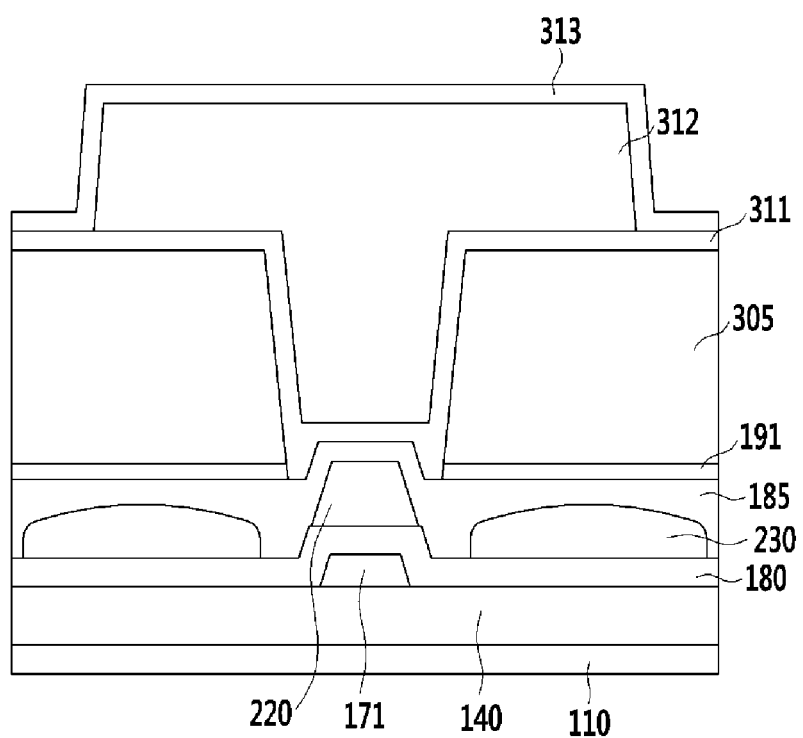
Figure 18D:
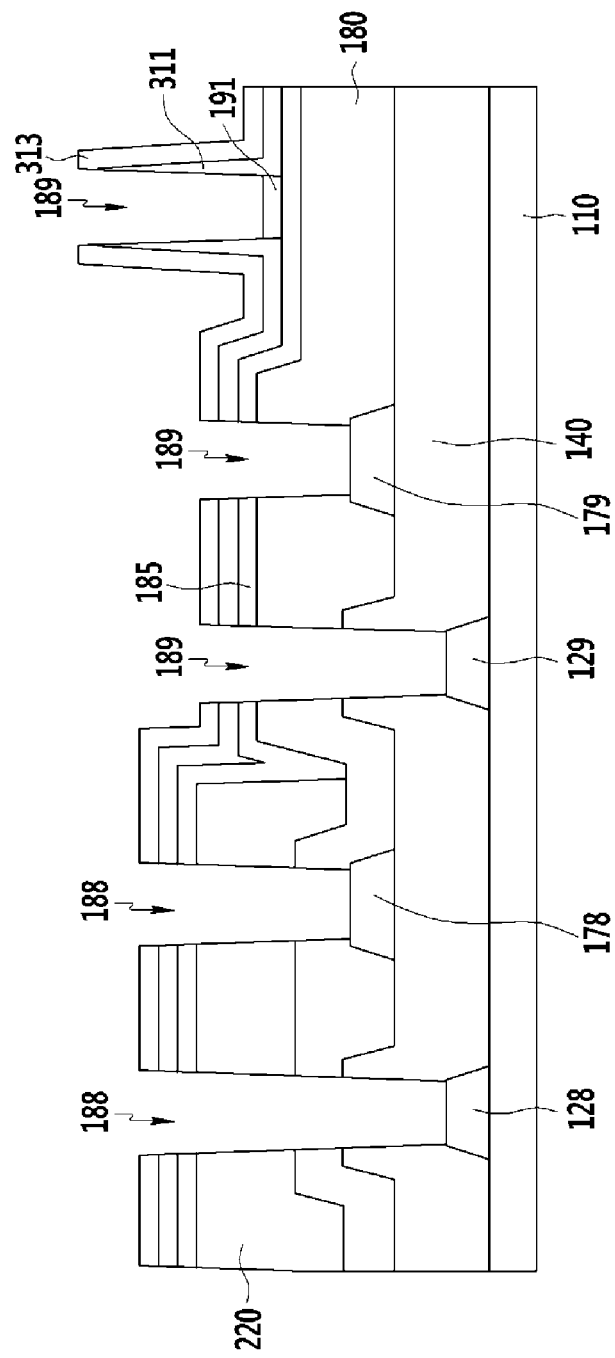

Thereafter, as shown in FIGS. 18A to 18D, the liquid crystal injection hole 335 and the contact hole 186, through which a portion of the drain electrode 175 is exposed, are formed together. FIGS. 18A to 18D are cross-sectional views corresponding to FIGS. 2 to 5. In such an embodiment, as shown in FIG. 18D, the bridge and pad holes 188 and 189 may be formed together with the liquid crystal injection hole 335 and the contact hole 186. In an exemplary embodiment, as described above, the liquid crystal injection hole 335 and the contact hole 186 are etched using one mask, and the number of the masks used in the method is thereby substantially reduced.

After the photoresist is applied, a photoresist pattern is formed using the mask to form the liquid crystal injection hole 335 and the contact hole 186. Thereafter, a lower portion of the photoresist pattern is etched using the photoresist as the mask to form the liquid crystal injection hole 335 and the contact hole 186. In an exemplary embodiment, the second upper insulating layer 313, the first upper insulating layer 311 and the sacrificial layer 300 are etched using the photoresist as the mask, and layers there below (common electrode 191 and the like) are not etched.

The sacrificial layer 300 is exposed to the outside through the liquid crystal injection hole 335. In an exemplary embodiment, the sacrificial layer 300 including the photoresist and the photoresist for etching the liquid crystal injection hole 335 and the contact hole 186, which remains on an upper portion thereof, may be wet etched together. In an exemplary embodiment, the photoresist pattern remaining on the second upper insulating layer 313 may be removed, e.g., immersed in an etchant for removing the photoresist pattern (for example, photoresist stripper) to be wet etched, together with the sacrificial layer 300. In such an embodiment, the process of removing the photoresist on the second upper insulating layer 313 and the process of removing the sacrificial layer 300 may be performed together, such that a manufacturing process is simplified.

In an alternative exemplary embodiment, where the sacrificial layer 300 includes a material other than the photoresist, the process of removing the photoresist on the second upper insulating layer 313 and the process of removing the sacrificial layer 300 may be separately performed. In such an embodiment, the sacrificial layer 300 may be provided using dry etching instead of wet etching.

As described above, when the sacrificial layer 300 is removed, the microcavity layer 305 is provided at a position of the sacrificial layer 300 as shown in FIGS. 18A to 18D.

Figure 19:
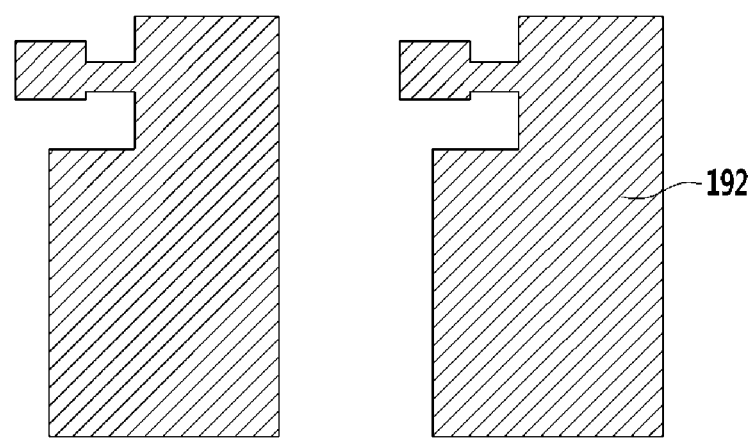
Figure 20A:
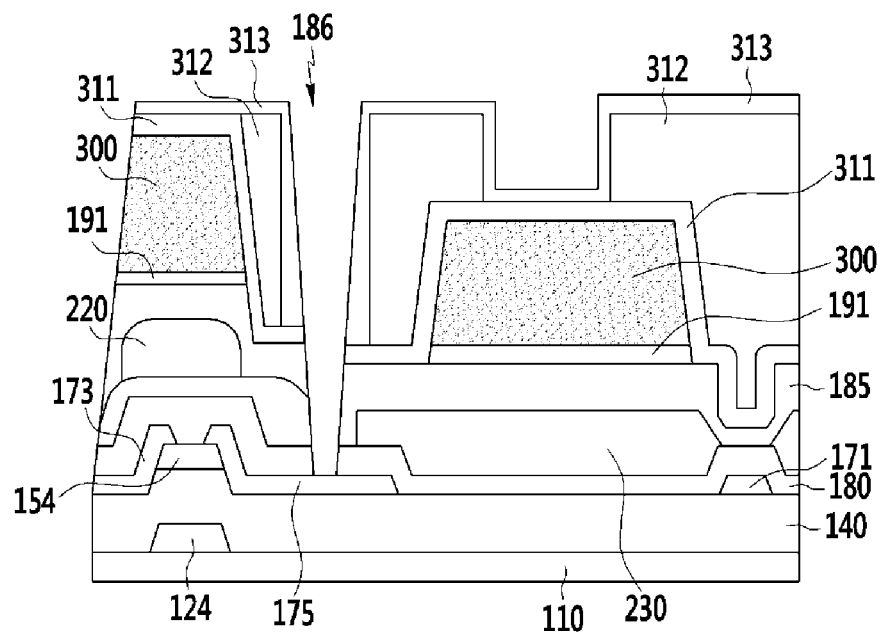
FIGS. 20A to 22 are views illustrating an alternative exemplary embodiment of a method of manufacturing a liquid crystal display according to the invention.
Figure 20B:
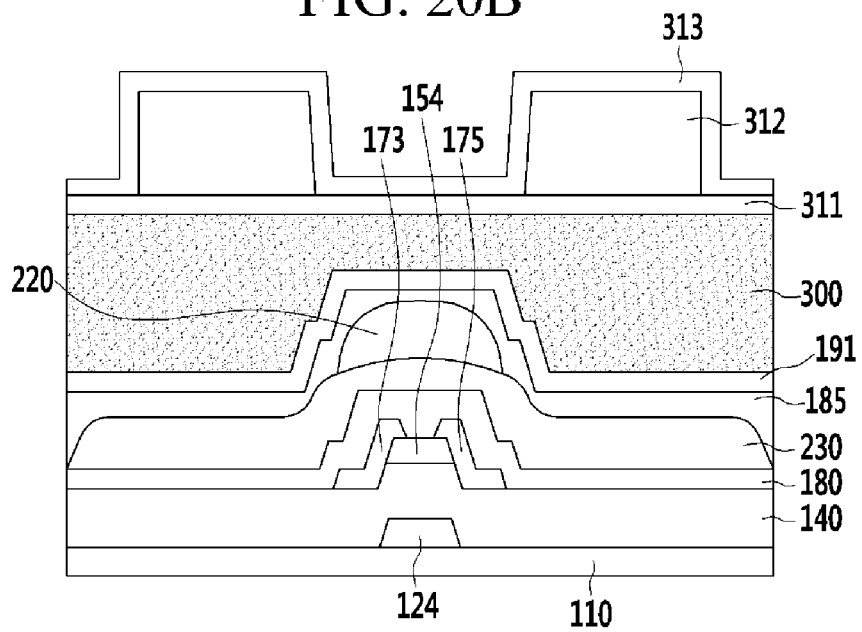
Figure 20C:
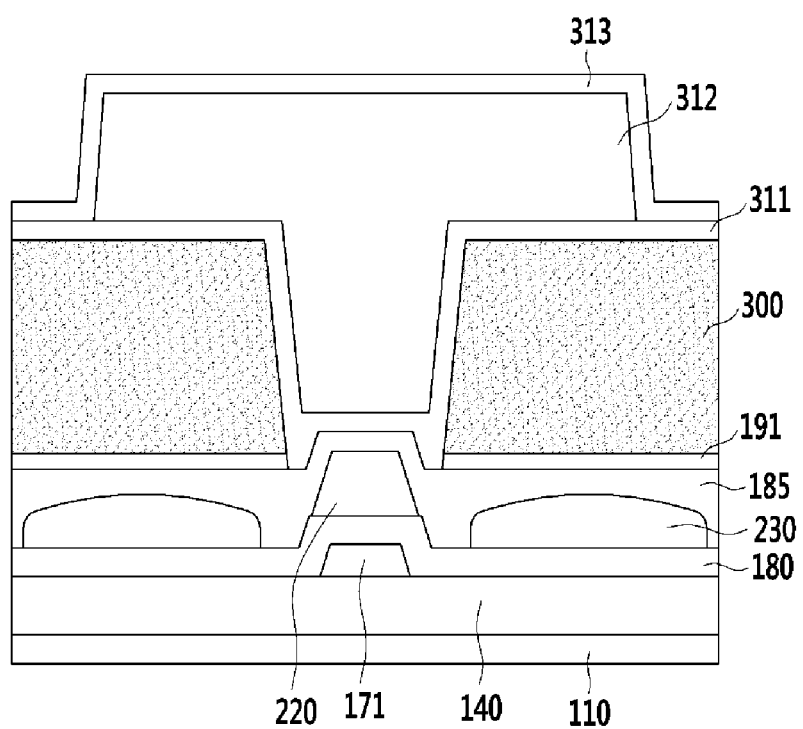
Figure 20D:
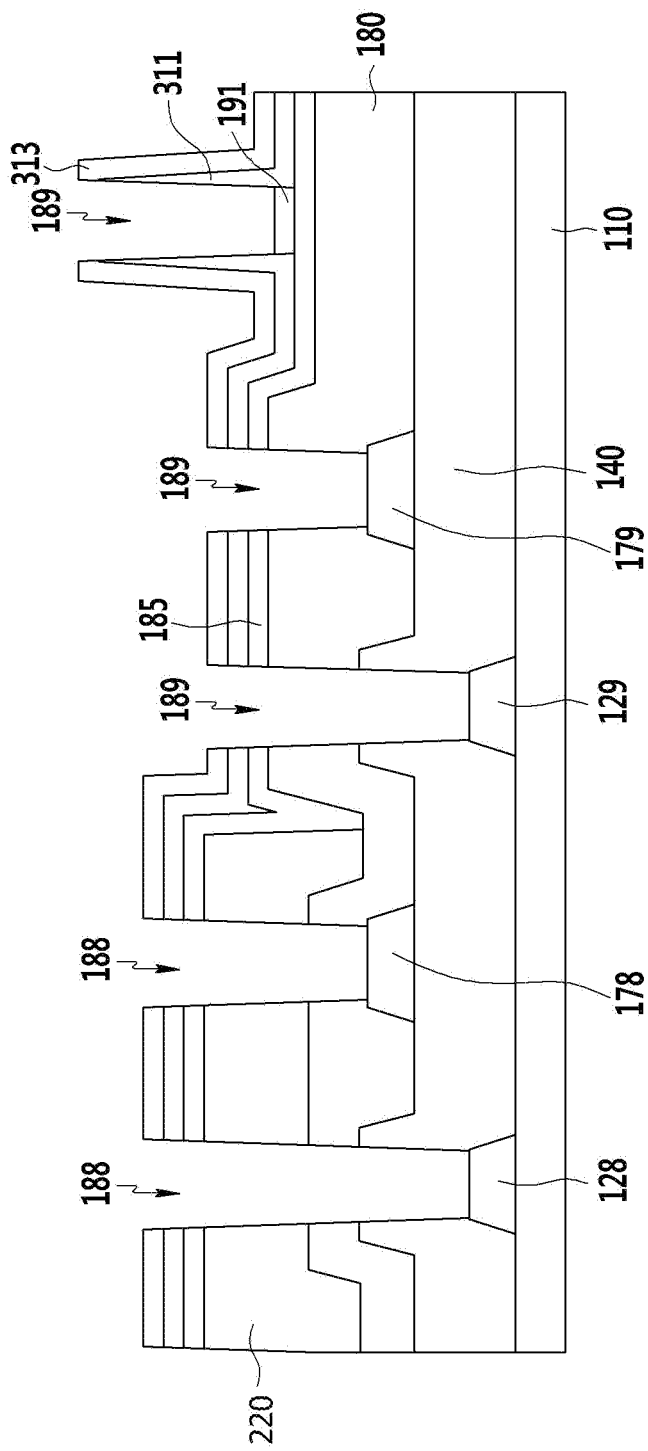

Thereafter, as shown in FIG. 19, the pixel electrode 192 is provided on the opening 312' of the pixel electrode region, the opening 312' of the drain electrode exposing region, the connection opening 312' through which the openings are connected, and the second upper insulating layer 313. The pixel electrode 192 is electrically connected to the drain electrode 175 exposed through the drain electrode exposing region. The pixel electrode 192 may include a transparent conductive material such as ITO or IZO.

In an exemplary embodiment, as shown in FIG. 5, the bridge 198 and the pad 199 include the transparent conductive material such as ITO or IZO and may be provided together in the bridge region and the pad region. The bridge 198 connects the portion 128 of the wiring provided in the same layer as the gate line and the portion 178 of the wiring provided in the same layer as the data line. In such an embodiment, the pad may include the pad 199 connected to the extended portion 129 disposed outside the gate line 121, the pad 199 connected to the extended portion 179 disposed outside the data line 171, and the pad 199 that applies a common voltage to the common electrode 191.

In an exemplary embodiment, the common electrode 191 or the pixel electrode 192 may include domain division members such as a groove or a protrusion, for example. In an exemplary embodiment, the common electrode 191 or the pixel electrode 192 may have a horizontal or vertical stem portion and a fine branch portion that extends from the horizontal or vertical stem portion.

Thereafter, as shown in FIGS. 2 to 4, the liquid crystal layer including the liquid crystal molecules 310 is provided by injecting the liquid crystal material into the microcavity layer 305.

An alignment layer for aligning the liquid crystal molecules may be provided in the microcavity layer 305 before the liquid crystal material is injected, and thereafter, the liquid crystal material may be injected, and when the alignment layer and the liquid crystal material are injected, the alignment layer and the liquid crystal material may be injected into the microcavity layer 305 using capillary force. In an exemplary embodiment, an additional process may be performed to effectively prevent the liquid crystal material from being discharged through the liquid crystal injection hole 335 after the liquid crystal material is injected.

Thereafter, a process of providing, e.g., attaching, the polarizer (not shown) to a lower portion of the insulating substrate 110 and an upper portion of the second upper insulating layer 313 may be performed. The polarizer may include a polarization element generating polarization and a TAC layer to improve durability, and in an exemplary embodiment, directions of transmissive axes of an upper polarizer and a lower polarizer may be substantially vertical or parallel to each other.

In an exemplary embodiment, the number of the masks used in the method is substantially reduced by forming the liquid crystal injection hole 335 and the contact hole 186 using one mask. Further, when the common electrode 191 is provided, etching is performed using the formed sacrificial layer 300 as the mask without using a separate mask such that the number of the masks used in the method is substantially reduced.

In addition, a process time is shortened by wet etching the photoresist remaining after the forming the liquid crystal injection hole 335 and the contact hole 186, and the sacrificial layer 300 together.

Hereinafter, an alternative exemplary embodiment of a method of manufacturing the display device according to the invention will be described.

First, the illustrated exemplary embodiment of FIGS. 20 to 22 will be described.

FIGS. 20A to FIG. 22 are views illustrating an alternative exemplary embodiment of a method of manufacturing a liquid crystal display according to the invention.

The display device shown in FIGS. 20 to 22 is substantially the same as the exemplary embodiment of FIG. 1, and the process prior to the process shown in FIG. 20 is substantially the same as the processes shown in FIGS. 6 to 17.

In an exemplary embodiment, the gate line 121 is provided on the insulating substrate 110, and covered by the gate insulating layer 140 thereon, the semiconductor 154 is provided on the gate insulating layer 140, and thereafter, the data conductors 171, 173 and 175 are provided. Thereafter, the first passivation layer 180 is provided to cover the data conductors 171, 173 and 175, the color filter 230 is provided on the first passivation layer 180, and the light blocking member 220 is provided on the color filter 230. Thereafter, the second passivation layer 185 is provided to cover the light blocking member 220 and the color filter 230, the conductive material 190 for the common electrode and the photoresist for the sacrificial layer are provided, e.g., laminated, thereon, and the photoresist for the sacrificial layer is patterned using the mask. Thereafter, the conductive material 190 for the common electrode is etched using the sacrificial layer 300 as the mask to shape the common electrode 191. Thereafter, the first upper insulating layer 311 covers substantially the entire structure there below, and the roof layer 312 having the opening 312' is provided on the first upper insulating layer 311. Then, the second upper insulating layer 313 covers substantially the entire structure there below.

The processes described above are substantially the same as the processed described with reference to FIGS. 6 to 17.

Thereafter, as shown in FIGS. 20A to 20D, the contact hole 186, through which a portion of the drain electrode 175 is exposed, is formed. In such an embodiment, the bridge and pad holes 188 and 189 in the peripheral are may be formed together with the contact hole 186. In such an embodiment, the liquid crystal injection hole 335 is not formed together with the contact hole 186.

Figure 21A:
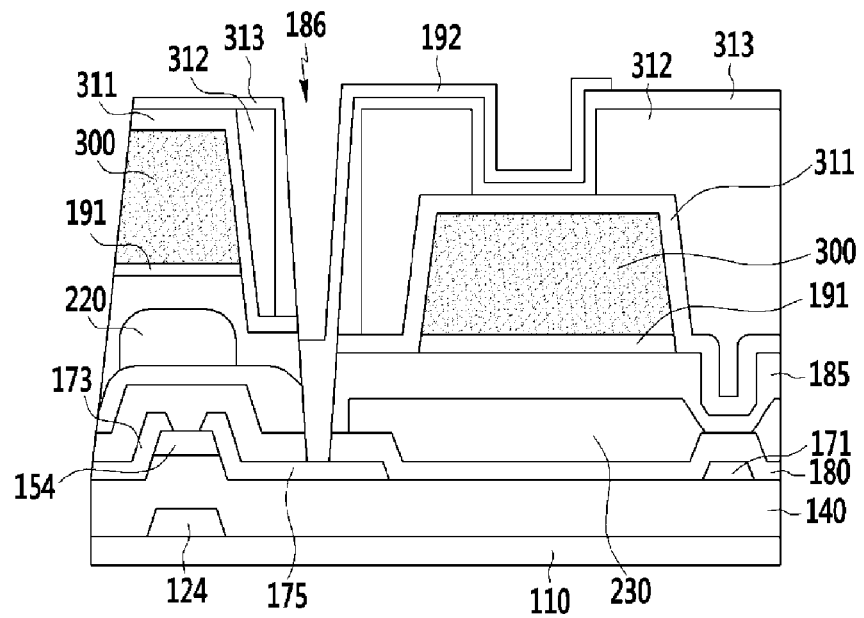
Figure 21B:
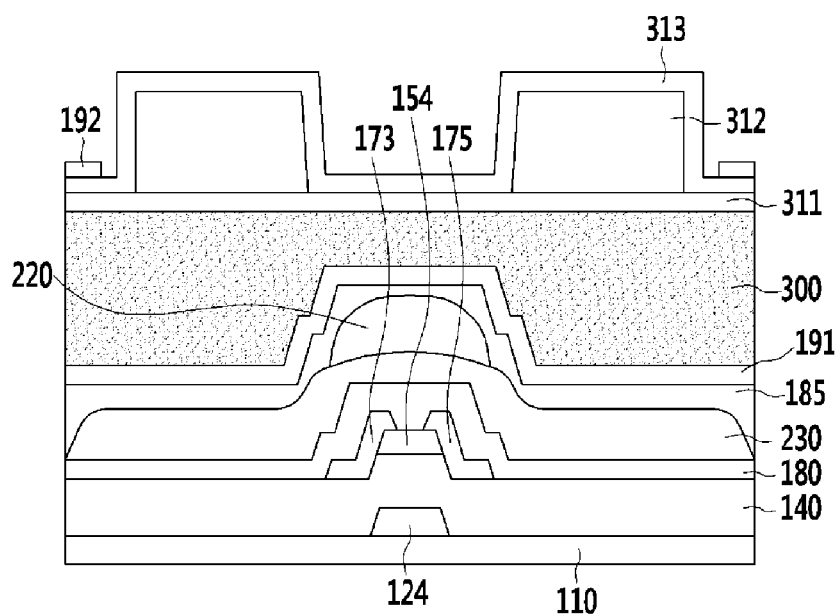
Figure 21C:
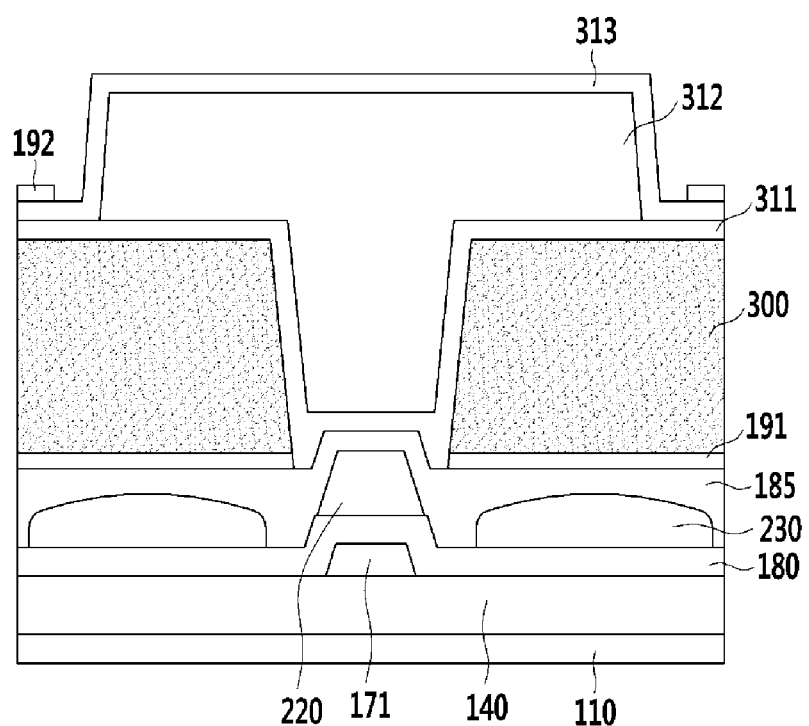
Figure 21D:
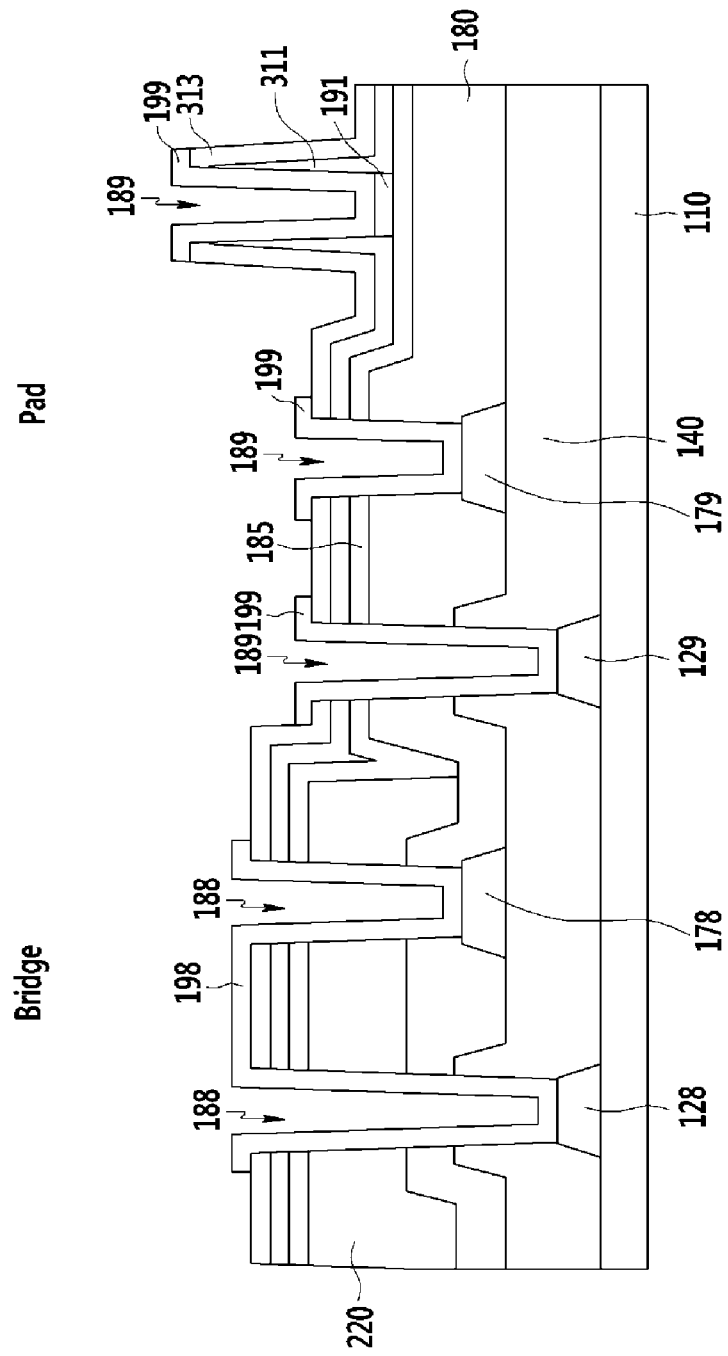
Figure 22A:
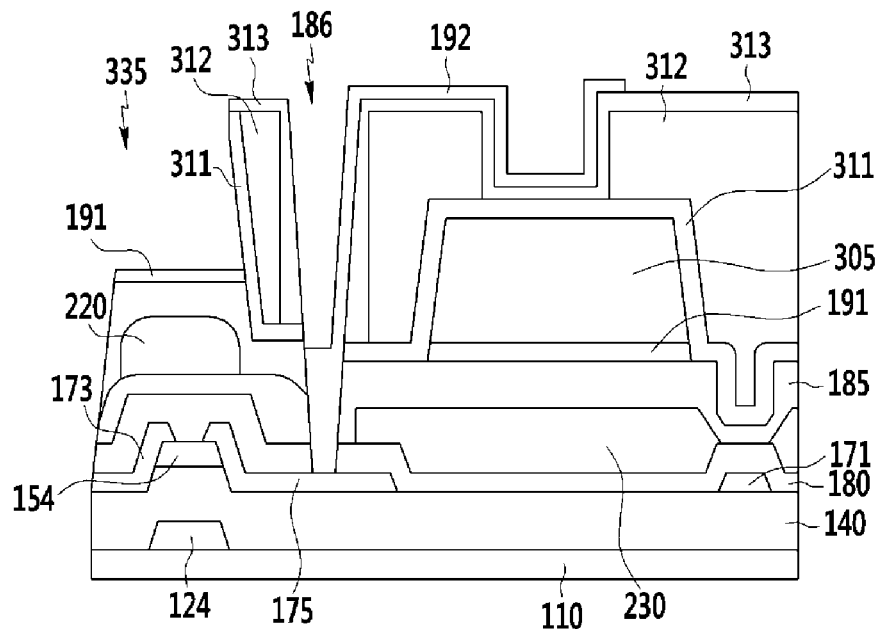
Figure 22B:
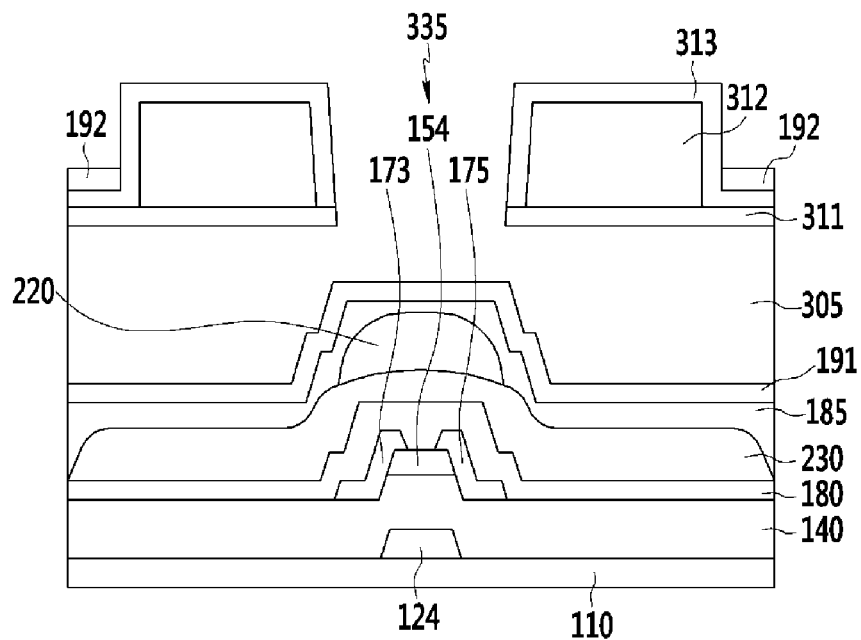
Figure 22C:
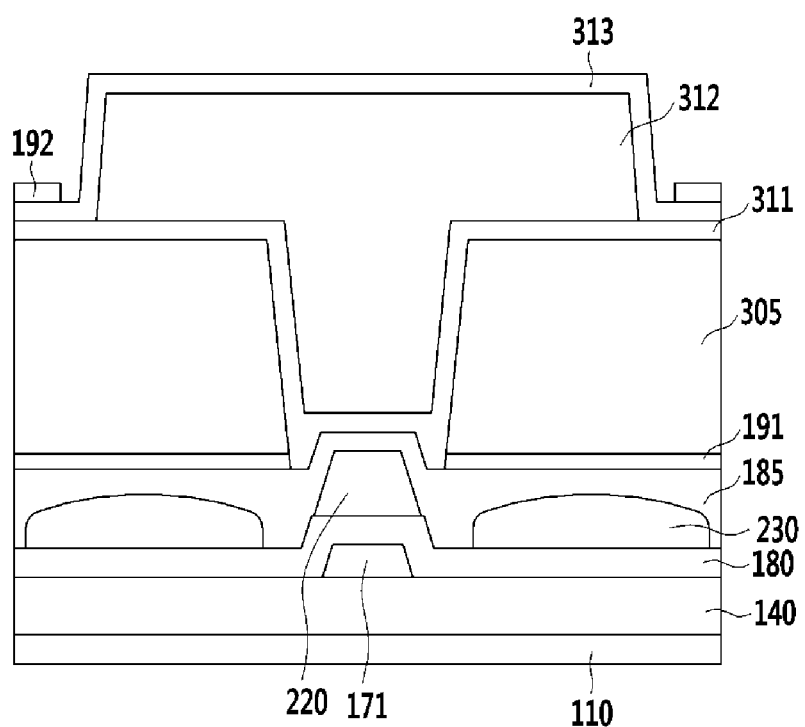
Figure 22D:
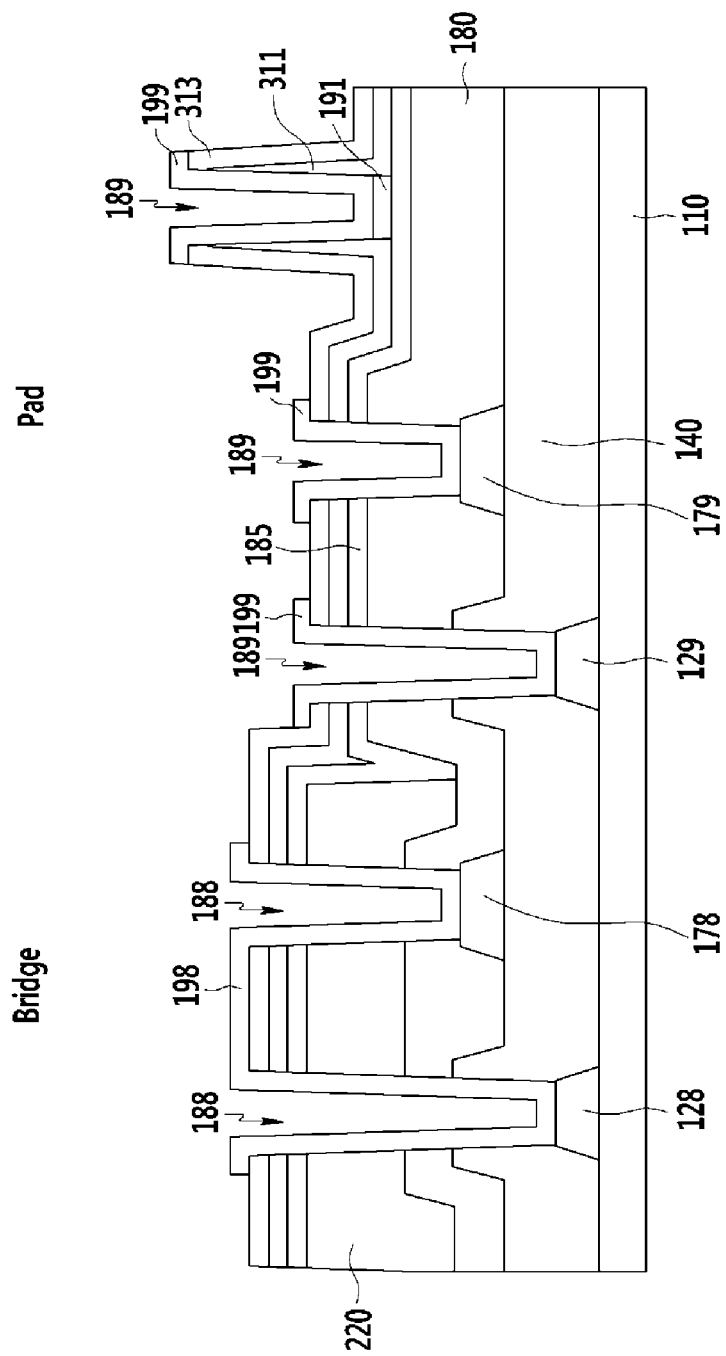

Thereafter, as shown in FIGS. 21A to 21D, the pixel electrode 192 includes the transparent conductive material such as ITO or IZO on the opening 312' of the pixel electrode region, the opening 312' of the drain electrode exposing region, the connection opening 312' through which the openings are connected, and the second upper insulating layer 313. The pixel electrode 192 is electrically connected to the drain electrode 175 exposed in the drain electrode exposing region. In an exemplary embodiment, as shown in FIG. 21D, the bridge 198 and the pad 199 includes the transparent conductive material such as ITO or IZO and are provided together in the bridge region and the pad region. The bridge 198 connects the portion 128 of the wiring provided in the same layer as the gate line and the portion 178 of the wiring provided in the same layer as the data line to each other. In such an embodiment, the pad 199 may include the pad 199 connected to the extended portion 129 disposed outside the gate line 121, the pad 199 connected to the extended portion 179 disposed outside the data line 171, and the pad 199 that applies a common voltage to the common electrode 191.

Thereafter, as shown in FIGS. 22A to 22D, the liquid crystal injection hole 335 is formed. After the photoresist is applied, the photoresist pattern is shaped using the mask to form the liquid crystal injection hole 335. Thereafter, a lower portion thereof is etched using the photoresist as the mask to form the liquid crystal injection hole 335. In such an embodiment, the second upper insulating layer 313, the first upper insulating layer 311 and the sacrificial layer 300 are etched, and layers there below (common electrode 191 and the like) are not etched.

The sacrificial layer 300 is exposed to the outside through the liquid crystal injection hole 335, and in an exemplary embodiment, where the sacrificial layer 300 includes the photoresist and the photoresist for etching the liquid crystal injection hole 335 and the contact hole 186 remains on an upper portion thereof, the sacrificial layer 300 and the photoresist for pattern may be wet etched together. In such an embodiment, the photoresist pattern remaining on the second upper insulating layer 313 may be removed, e.g., immersed in an etchant removing the photoresist pattern (for example, photoresist stripper) to be wet etched, together with the sacrificial layer 300. In such processes, the process of removing the photoresist on the second upper insulating layer 313 and the process of removing the sacrificial layer 300 may be performed together, such that a manufacturing process is substantially simplified.

In an alternative exemplary embodiment, where the sacrificial layer 300 includes a material other than the photoresist, two processes may be separately performed for removing the sacrificial layer 300 and the photoresist for pattern. In such an embodiment, the sacrificial layer 300 may be formed by dry etching instead of wet etching.

As described above, when the sacrificial layer 300 is removed, the microcavity layer 305 is provided at a position of the sacrificial layer 300 as shown in FIGS. 22A to 22D.

Thereafter, the liquid crystal layer including the liquid crystal molecules 310 is provided by injecting the liquid crystal material into the microcavity layer 305.

An alignment layer for aligning the liquid crystal molecules may be provided in the microcavity layer 305 before the liquid crystal material is injected, and thereafter, the liquid crystal material may be injected, and when the alignment layer and the liquid crystal material are injected, the alignment layer and the liquid crystal material may be injected into the microcavity layer 305 using capillary force. An additional process may be performed to effectively prevent the liquid crystal material from being discharged through the liquid crystal injection hole 335 after the liquid crystal material is injected.

Thereafter, a process of attaching the polarizer (not shown) to a lower portion of the insulating substrate 110 and an upper portion of the second upper insulating layer 313 may be further performed. The polarizer may include a polarization element generating polarization and a TAC layer for improving durability, and in an exemplary embodiment, directions of transmissive axes of an upper polarizer and a lower polarizer may be substantially vertical or parallel to each other.

In an exemplary embodiment, as described above, the liquid crystal injection hole 335 and the contact hole 186 may be formed using different masks. In such an embodiment, as in the exemplary embodiment of FIGS. 6 to 19, when the common electrode 191 is formed, etching is performed using the provided sacrificial layer 300 as the mask without using a separate mask such that the number of the masks used in the method is substantially reduced.

In such an embodiment, a process time is shortened by wet etching the photoresist remaining after forming the liquid crystal injection hole 335 and the contact hole 186, and the sacrificial layer 300 together.

Figure 23A:
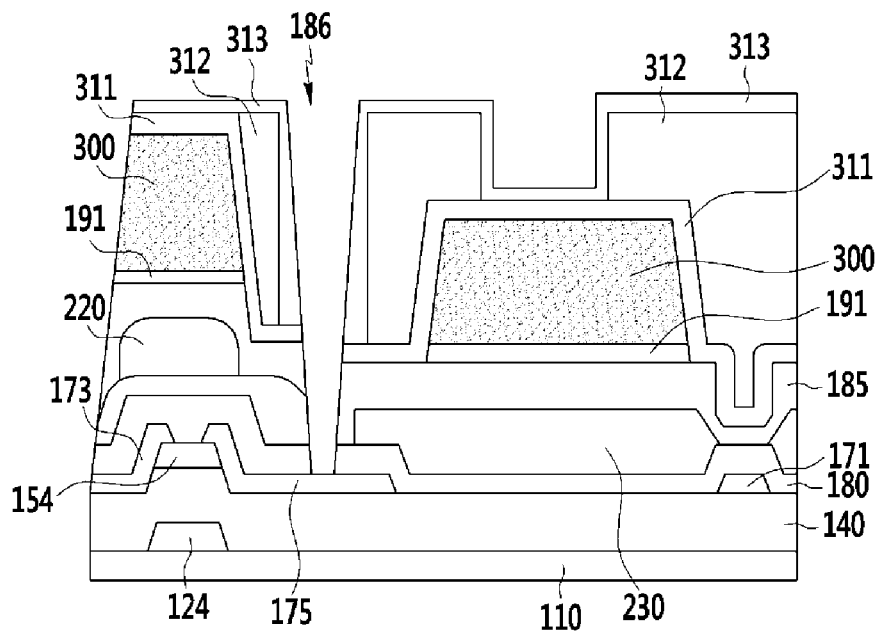
FIGS. 23A to 25 are views illustrating another alternative exemplary embodiment of a method of manufacturing a liquid crystal display according to the invention.
Figure 23B:
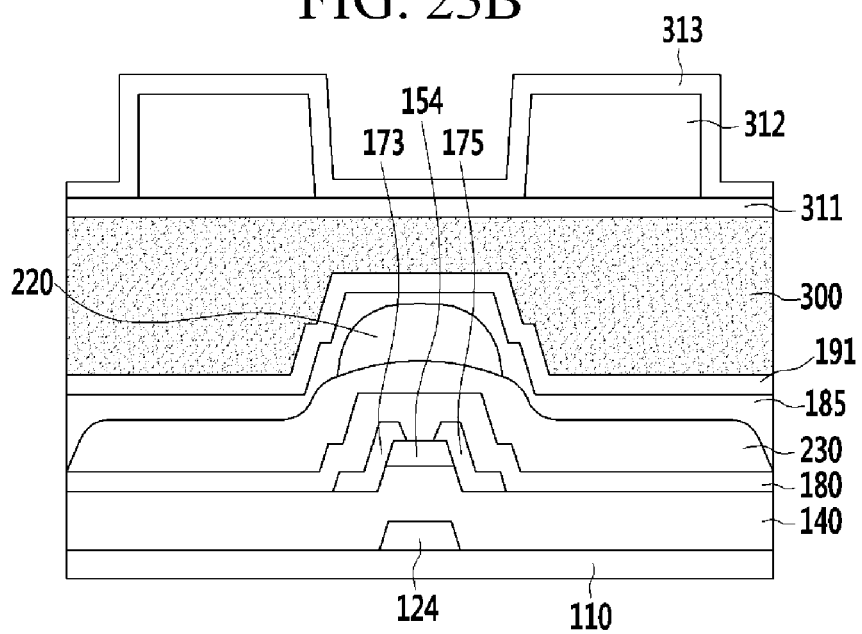
Figure 23C:
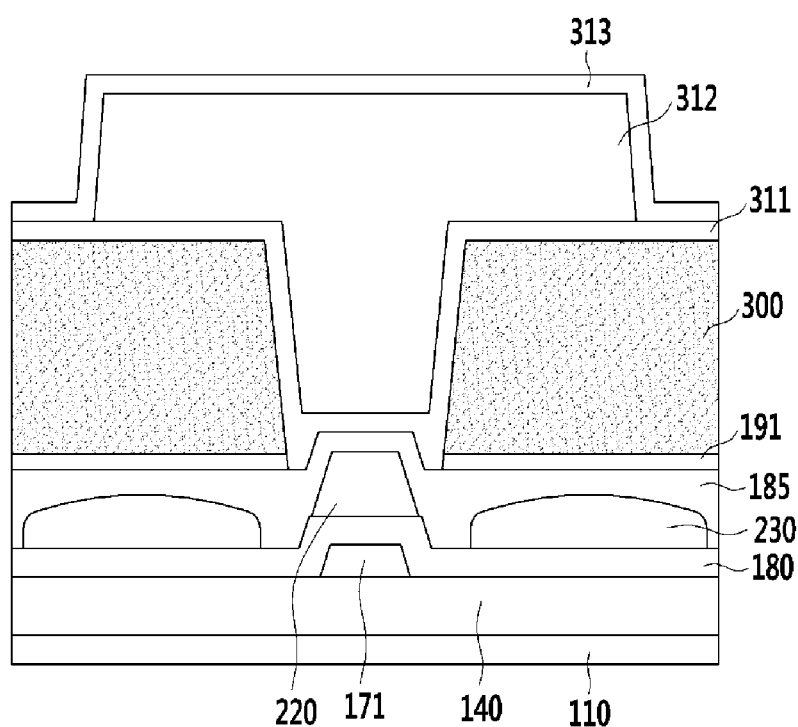
Figure 24A:
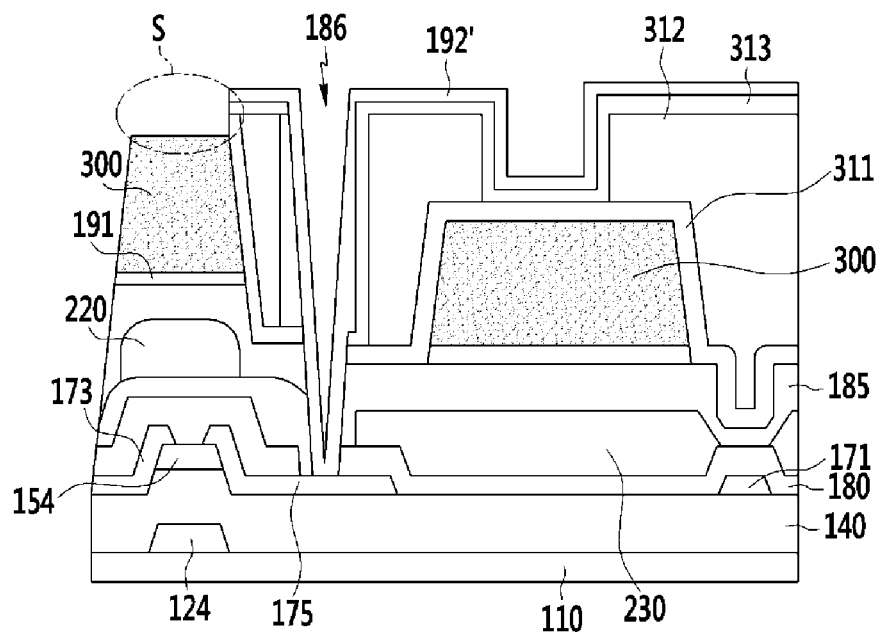
Figure 24B:
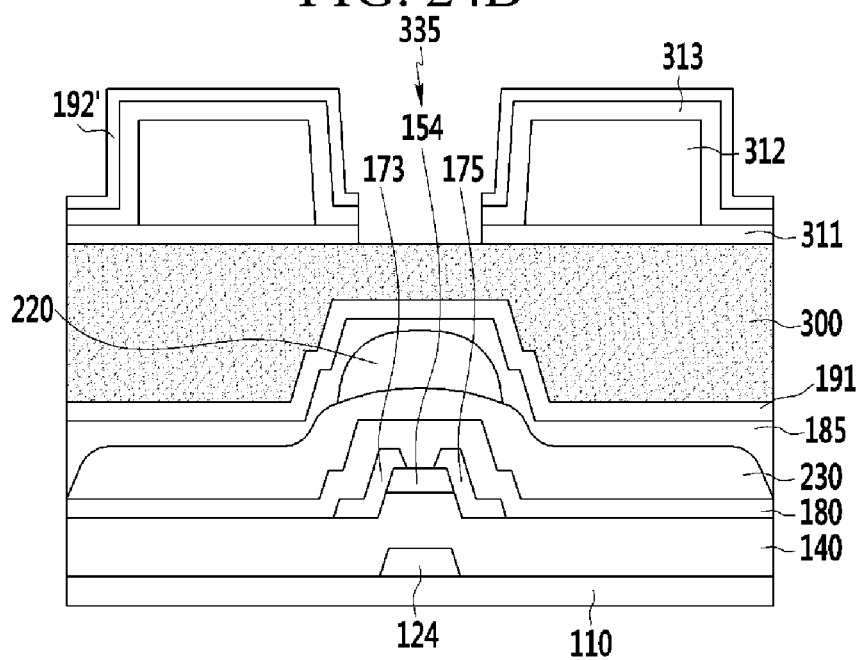
Figure 24C:
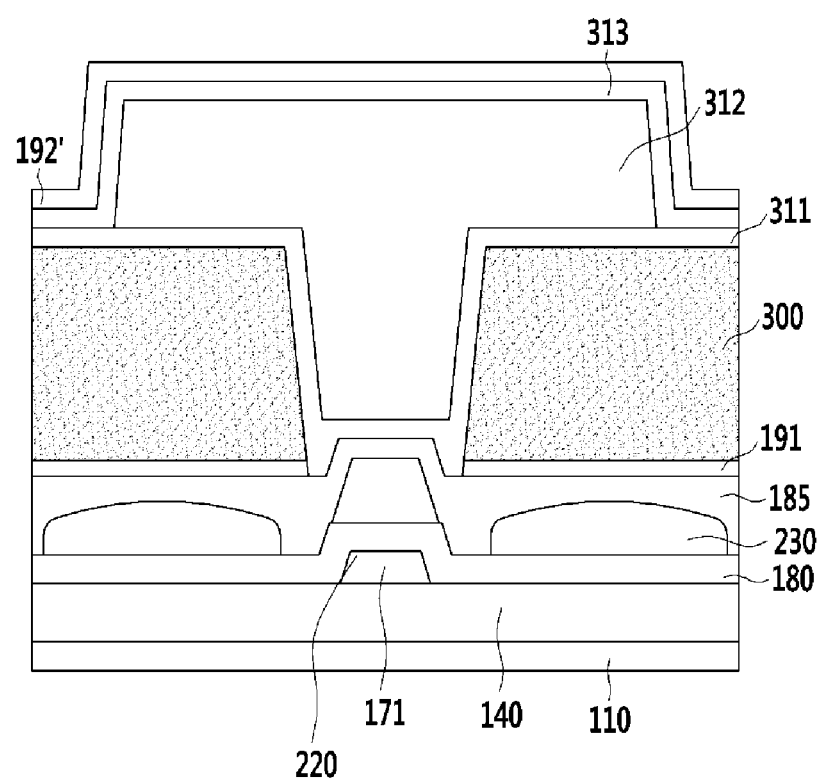
Figure 24D:
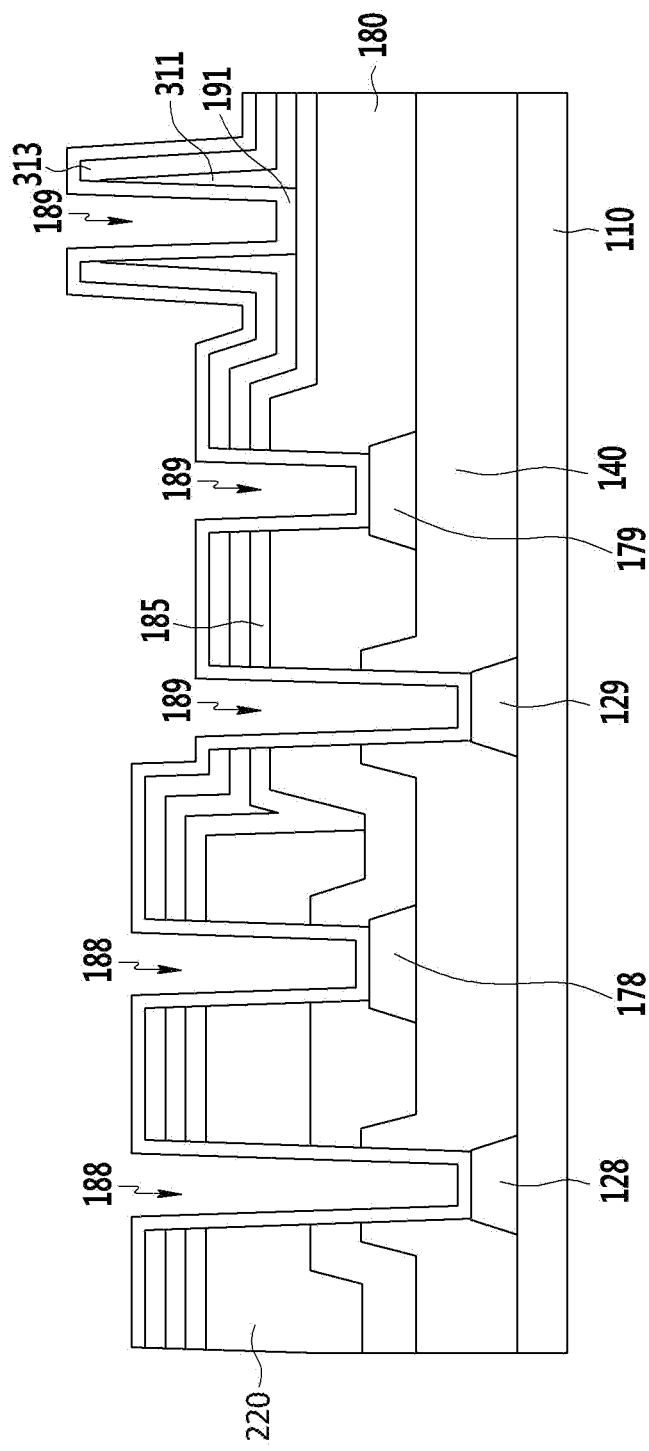
Figure 25A:
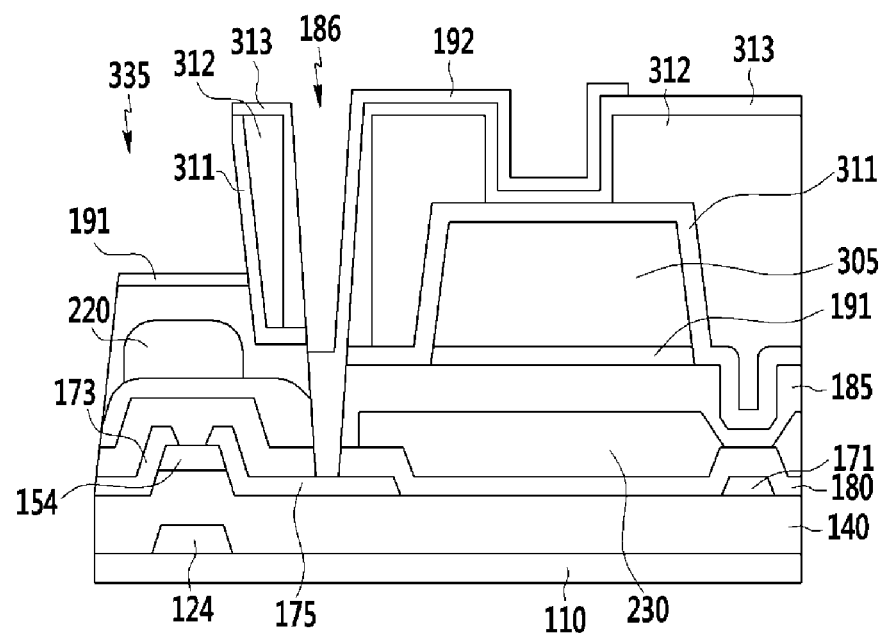
Figure 25B:
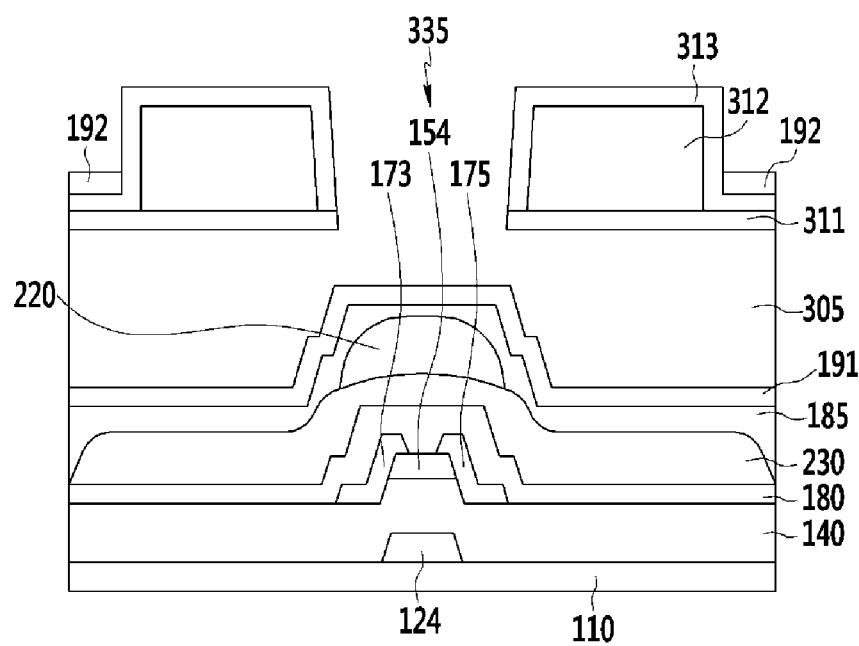
Figure 25C:
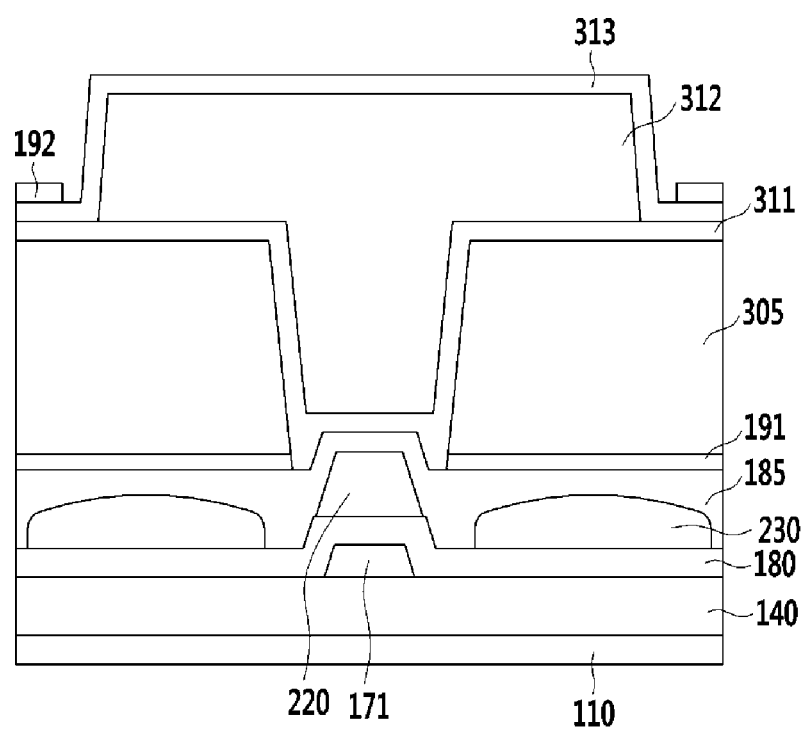

Hereinafter, another alternative exemplary embodiment of a method of manufacturing a liquid crystal display will be described with reference to FIGS. 23 to 25.

FIGS. 23 to 25 are views illustrating another alternative exemplary embodiment of a method of manufacturing a liquid crystal display according to the invention.

The exemplary embodiment of the liquid crystal display of FIGS. 23 to 25 is substantially the same as the liquid crystal display of FIG. 1, and the processes prior to the process shown in FIG. 23 is substantially the same as the processes shown in FIGS. 6 to 17.

In an exemplary embodiment, the gate line 121 is disposed on the insulating substrate 110, and covered by the gate insulating layer 140, the semiconductor 154 is provided on the gate insulating layer 140, and thereafter, the data conductors 171, 173 and 175 are provided. Thereafter, the first passivation layer 180 provided to substantially cover the layers there below, the color filter 230 is provided on the first passivation layer 180, and the light blocking member 220 is provided on the color filter 230. Thereafter, the second passivation layer 185 is provided to cover the layers there below, the conductive material 190 for the common electrode and the photoresist for the sacrificial layer are provided, e.g., laminated, on the second passivation layer 185, and the photoresist for the sacrificial layer is patterned using the mask. Thereafter, the conductive material 190 for the common electrode is etched using the sacrificial layer 300 as the mask to form the common electrode 191. Thereafter, the first upper insulating layer 311 is provided to cover substantially the entire structure there below, and the roof layer 312 having the opening 312' is provided on the first upper insulating layer 311. Thereafter, the second upper insulating layer 313 provided to cover substantially the entire structure there below.

The processes described above are substantially the same as the processes described with reference to FIGS. 6 to 17.

Thereafter, in an alternative exemplary embodiment as shown in FIGS. 23A to 23D, the contact hole 186 through which a portion of the drain electrode 175 is exposed is formed. In such an embodiment, the liquid crystal injection hole 335 is not formed together with the contact hole 186.

Thereafter, as shown in FIGS. 24A to 24D, after the transparent conductive material 192' such as ITO or IZO is provided, e.g., laminated, in the entire region, the transparent conductive material 192' such as ITO or IZO is etched (first etching) only in the region in which the liquid crystal injection hole 335 is to be formed (liquid crystal injection hole forming region). (See the S region of FIG. 24A). In such an embodiment, the transparent conductive material 192' is provided in substantially the entire region except for the region in which the liquid crystal injection hole 335 is to be formed (liquid crystal injection hole forming region).

Thereafter, as shown in FIGS. 25A to 25D, the liquid crystal injection hole 335 is formed by removing the sacrificial layer 300 (see the S region of FIG. 24A) exposed by the first etching. As a result, the sacrificial layer 300 is exposed to the outside by forming the liquid crystal injection hole 335. Thereafter, the pixel electrode 192 is completed by additionally etching the transparent conductive material 192' (second etching). Thereafter, the sacrificial layer 300 exposed through the liquid crystal injection hole 335 is removed. In an alternative exemplary embodiment, the sacrificial layer 300 exposed through the liquid crystal injection hole 335 may be removed prior to the second etching.

In an exemplary embodiment, where the sacrificial layer 300 includes the photoresist and the photoresist for etching the liquid crystal injection hole 335 and the contact hole 186 remains on an upper portion thereof, the sacrificial layer 300 may be wet etched together with the photoresist for etching the liquid crystal injection hole 335 and the contact hole 186. In such an embodiment, the photoresist pattern remaining on the second upper insulating layer 313 may be removed, e.g., immersed in an etchant removing the photoresist pattern (for example, photoresist stripper) to be wet etched, together with the sacrificial layer 300. In such an embodiment, the process of removing the photoresist formed on the second upper insulating layer 313 and the process of removing the sacrificial layer 300 may be performed together, such that the manufacturing process is substantially simplified.

In FIGS. 24A to 24D and FIGS. 25A to 25D, the etching process may be performed by the following method.

First, the transparent conductive material 192' such as ITO or IZO is applied on the entire substrate, and the photoresist is provided thereon. Thereafter, the photoresist is not provided or thinly provided in the liquid crystal injection hole forming region (S of FIG. 24A), and is thickly provided in the remaining region. In such an embodiment, a slit mask or a transflective mask may be used to control the thickness of the photoresist.

Thereafter, the etching process is performed to remove the transparent conductive material 192', the first upper insulating layer 311 and the second upper insulating layer 313 positioned in the S region as shown in FIGS. 24A to 24D.

Thereafter, the sacrificial layer 300 on the liquid crystal injection hole forming region is removed through an etch back process to complete the liquid crystal injection hole 335. In an exemplary embodiment, the photoresist, which is used to form the liquid crystal injection hole forming region (S of FIG. 24A) and remains after the etching process, may be removed.

Thereafter, the photoresist is applied again to form the pattern, and the transparent conductive material 192' is additionally etched to provide the pixel electrode 192, the bridge 198 and the pad 199.

Thereafter, the remaining photoresist and the sacrificial layer 305 (formed of the photoresist) in the microcavity layer 305 may be removed, e.g., immersed in the photoresist stripper to wet etch the remaining photoresist pattern, together with the sacrificial layer 300.

In an exemplary embodiment of the display device, the pixel electrode 192 is disposed on the opening 312' of the pixel electrode forming region, the opening 312' of the drain electrode exposing region, the connection opening 312' through which the openings are connected, and the second upper insulating layer 313. In such an embodiment, the pixel electrode 192 is electrically connected to the drain electrode 175 exposed in the drain electrode exposing region.

Thereafter, the liquid crystal layer including the liquid crystal molecules 310 is formed by injecting the liquid crystal material into the formed microcavity layer 305.

An alignment layer for aligning the liquid crystal molecules may be provided in the microcavity layer 305 before the liquid crystal material is injected, and thereafter, the liquid crystal material may be injected, and when the alignment layer and the liquid crystal material are injected, the alignment layer and the liquid crystal material may be injected into the microcavity layer 305 using capillary force. An additional process may be performed to effectively prevent the liquid crystal material from being discharged through the liquid crystal injection hole 335 after the liquid crystal material is injected.

Thereafter, a process of attaching the polarizer (not shown) to a lower portion of the insulating substrate 110 and an upper portion of the second upper insulating layer 313 may be added. The polarizer may include a polarization element generating polarization and a TAC layer for ensuring durability, and in an exemplary embodiment, directions of transmissive axes of an upper polarizer and a lower polarizer may be substantially vertical or parallel to each other.

In an exemplary embodiment, as described above, the liquid crystal injection hole 335 and the contact hole 186 are formed using different masks. In such an embodiment, when the common electrode 191 is formed, etching is performed using the formed sacrificial layer 300 as the mask without using a separate mask such that the number of the masks used in the method is substantially reduced.

In such an embodiment, a process time is shortened by wet etching the photoresist remaining after providing the pixel electrode 192 together with the sacrificial layer 300.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate;
   a thin film transistor disposed on the substrate, wherein the thin film transistor comprises a drain electrode;
   a passivation layer disposed on the substrate covering the thin film transistor;
   a common electrode disposed on the passivation layer, wherein the common electrode receives a common voltage;
   a liquid crystal layer disposed in a microcavity layer on the common electrode;
   a roof layer disposed covering the liquid crystal layer; and
   a pixel electrode disposed on the roof layer,
   wherein
   a first opening is defined in a portion of the roof layer, the first opening overlapping the liquid crystal layer in a direction substantially perpendicular to the substrate and being disposed above the liquid crystal layer at a pixel electrode region, in which the pixel electrode is disposed,
   a second opening is defined in the roof layer at a drain electrode exposing region, through which the drain electrode of the thin film transistor is exposed, and
   a connection opening, which connects the first opening and the second opening, is defined in the roof layer.

2. The display device of claim 1, wherein the pixel electrode is disposed in a region on the first opening, the second opening, and the connection opening.

3. The display device of claim 1, wherein a side of the common electrode is substantially aligned with a corresponding side of the microcavity layer.

4. The display device of claim 3, wherein the side of the common electrode extends in an extension direction of the common electrode.

5. The display device of claim 3, wherein the common electrode is not disposed on a drain electrode exposing region, through which the drain electrode of the thin film transistor is exposed.

6. The display device of claim 1, further comprising:
   a color filter disposed between the passivation layer and the common electrode; and
   a light blocking member disposed between the passivation layer and the common electrode.

7. The display device of claim 1, wherein a portion of the pixel electrode is disposed in the first opening.

* * * * *